(12) United States Patent
Chen et al.

(10) Patent No.: US 12,484,246 B2
(45) Date of Patent: Nov. 25, 2025

(54) METHOD OF MANUFACTURING A SEMICONDUCTOR DEVICE INCLUDING FORMING A SIDEWALL SPACER ON A SIDEWALL OF A CHANNEL STRUCTURE

(71) Applicant: TAIWAN SEMICONDUCTOR MANUFACTURING COMPANY, LTD., Hsinchu (TW)

(72) Inventors: Shih-Cheng Chen, New Taipei (TW); Zhi-Chang Lin, Hsinchu County (TW); Jung-Hung Chang, Changhua County (TW); Chien Ning Yao, Hsinchu (TW); Tsung-Han Chuang, Tainan (TW); Kai-Lin Chuang, Chiayi (TW); Kuo-Cheng Chiang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 638 days.

(21) Appl. No.: 17/843,835

(22) Filed: Jun. 17, 2022

(65) Prior Publication Data

US 2023/0411527 A1    Dec. 21, 2023

(51) Int. Cl.
| | |
|---|---|
| H10D 30/67 | (2025.01) |
| H01L 21/02 | (2006.01) |
| H10D 30/01 | (2025.01) |
| H10D 30/43 | (2025.01) |
| H10D 62/10 | (2025.01) |
| H10D 64/01 | (2025.01) |

(52) U.S. Cl.
CPC ... *H10D 30/6713* (2025.01); *H01L 21/02603* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/018* (2025.01)

(58) Field of Classification Search
CPC ............ H10D 30/014; H10D 30/6713; H10D 30/6735; H10D 30/797; H10D 64/017; H10D 64/018; H10D 64/021; H10D 62/121; H10D 30/43
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Khiem D Nguyen
(74) *Attorney, Agent, or Firm* — Maschoff Brennan

(57) ABSTRACT

A device includes a channel layer, a gate structure, a first source/drain epitaxial structure, a second source/drain epitaxial structure, and a sidewall spacer. The channel layer is over a substrate. The gate structure wraps around the channel layer. The first source/drain epitaxial structure and the second source/drain epitaxial structure are on opposite sides of the channel layer. The sidewall spacer is on a sidewall of the first source/drain epitaxial structure and includes a first dielectric layer and a second dielectric layer over the first dielectric layer and in contact with first source/drain epitaxial structure. The first dielectric layer and the second dielectric layer include different materials.

20 Claims, 35 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,756,175 B2* | 8/2020 | Lee | B82Y 10/00 |
| 10,950,731 B1* | 3/2021 | Peng | H10D 62/121 |
| 11,329,163 B2* | 5/2022 | More | H10D 30/6735 |
| 2016/0233320 A1* | 8/2016 | Chang | H10D 64/015 |
| 2021/0057539 A1* | 2/2021 | Chiang | H01L 21/02172 |
| 2022/0165881 A1* | 5/2022 | Min | H10D 30/6735 |

* cited by examiner

A

METHOD OF MANUFACTURING A SEMICONDUCTOR DEVICE INCLUDING FORMING A SIDEWALL SPACER ON A SIDEWALL OF A CHANNEL STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
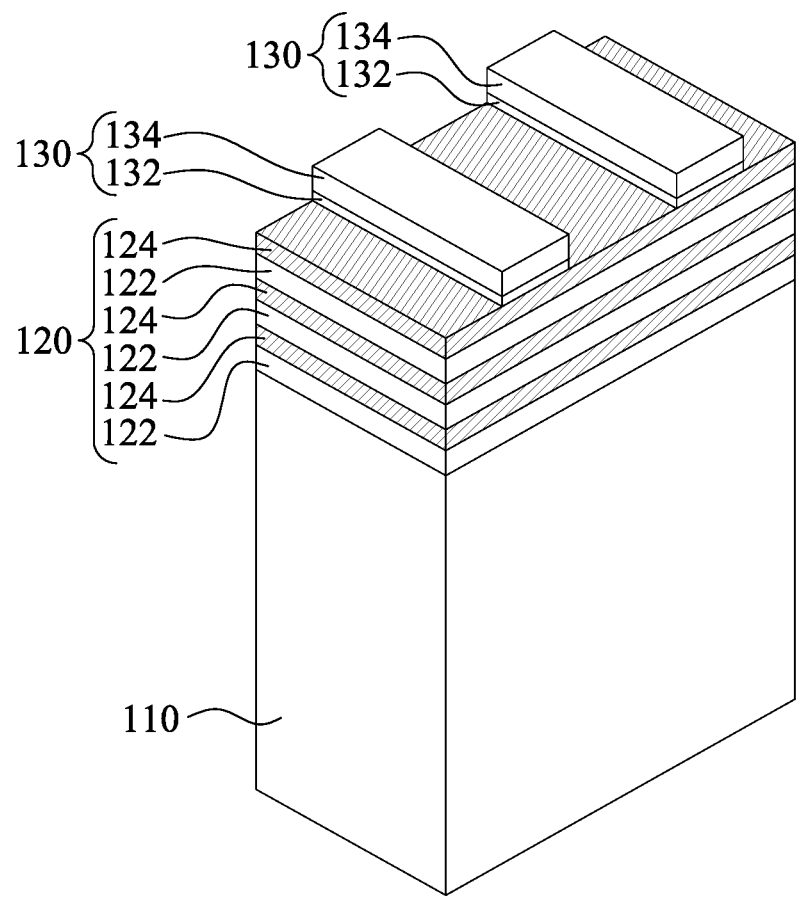
FIGS. 1-16B illustrate a method for manufacturing a semiconductor device (or an integrated circuit structure) at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices (or integrated circuit structures) and methods of forming the same. More particularly, some embodiments of the present disclosure are related to semiconductor devices having etched-back sidewall spacers on opposite sides of a source/drain epitaxial structure. The etched-back sidewall spacers provide an extra space for accommodating inner-spacer residues such that the inner-spacer residues do not cover the outer sidewalls of the channel layers, which may reduce the contact area between the source/drain epitaxial structure and the channel layers. The etched-back sidewall spacers also enlarge a window for growing the source/drain epitaxial structure.

FIGS. 1-16B illustrate a method for manufacturing a semiconductor device (or an integrated circuit structure) at various stages in accordance with some embodiments of the present disclosure. In addition to the integrated circuit structure, FIGS. 1-5A, 6A, 7A, 8A, and 10A depict X-axis, Y-axis, and Z-axis directions. In some embodiments, the semiconductor device shown in FIGS. 1-16B may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 1-5A, 6A, 7A, 8A, and 10A are perspective views of some embodiments of the semiconductor device at intermediate stages during fabrication. FIGS. 5B, 6B, 7B, 8B, 9A, 10B, 11A, 12A, 13A, 14A, 15A, and 16A are cross-sectional view of some embodiments of the semiconductor device during fabrication along a first cut (e.g., cut I-I), which is in the source/drain regions and along a lengthwise direction of gates. FIGS. 5C, 6C, 7C, 8C, 9B, 10C, 11B, 12B, 13B, 14B, 15B, and 16B are cross-sectional views of some embodiments of the semiconductor device during fabrication along a second cut (e.g., cut II-II), which is along a lengthwise direction of channels.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A semiconductor stack 120 is formed on the substrate 110 through epitaxy, such that the semiconductor stack 120 forms crystalline layers. The semiconductor stack 120 includes semiconductor layers 122 and 124 stacked alternatively. There may be two, three, four, or more of the semiconductor layers 122 and 124. The semiconductor layers 122 can be SiGe layers. The semiconductor layers 124 may be pure silicon layers that are free from germanium. The semiconductor layers 124 may also be substantially pure silicon layers, for example, with a germanium percentage lower than about 1 percent. Furthermore, the semiconductor layers 124 may be intrinsic, which are not doped with p-type and n-type impurities. In some other embodiments, however, the semiconductor layers 124 can be silicon germanium or germanium for p-type semiconductor device, or can be III-V materials, such as InAs, InGaAs, InGaAsSb, GaAs, InPSb, or other suitable materials.

The semiconductor layers 124 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the semiconductor layers 124 to define a channel or channels of the semiconductor device is further discussed below.

As described above, the semiconductor layers 124 may serve as channel region(s) for a subsequently-formed semiconductor device and the thickness is chosen based on device performance considerations. The semiconductor layers 122 in channel regions(s) may eventually be removed and serve to define a vertical distance between adjacent channel region(s) for a subsequently-formed multi-gate device and the thickness is chosen based on device performance considerations. Accordingly, the semiconductor layers 122 may also be referred to as sacrificial layers, and semiconductor layers 124 may also be referred to as channel layers.

A patterned hard mask 130 is formed over the semiconductor stack 120. The patterned hard mask 120 covers a portion of the semiconductor stack 120 while leaves another portion of the semiconductor stack 120 uncovered. In some embodiments, the patterned hard mask 130 includes an oxide layer 132 (e.g., a pad oxide layer that may include $SiO_2$) and a nitride layer 134 (e.g., a pad nitride layer that may include $Si_3N_4$) formed over the oxide layer. The oxide layer 132 may act as an adhesion layer between the semiconductor stack 120 and the nitride layer 134 and may act as an etch stop layer for etching the nitride layer 134. In some examples, the oxide layer 132 includes thermally grown oxide, chemical vapor deposition (CVD)-deposited oxide, and/or atomic layer deposition (ALD)-deposited oxide. In some embodiments, the nitride layer 134 is deposited on the oxide layer 132 by CVD and/or other suitable techniques.

Figure 2:
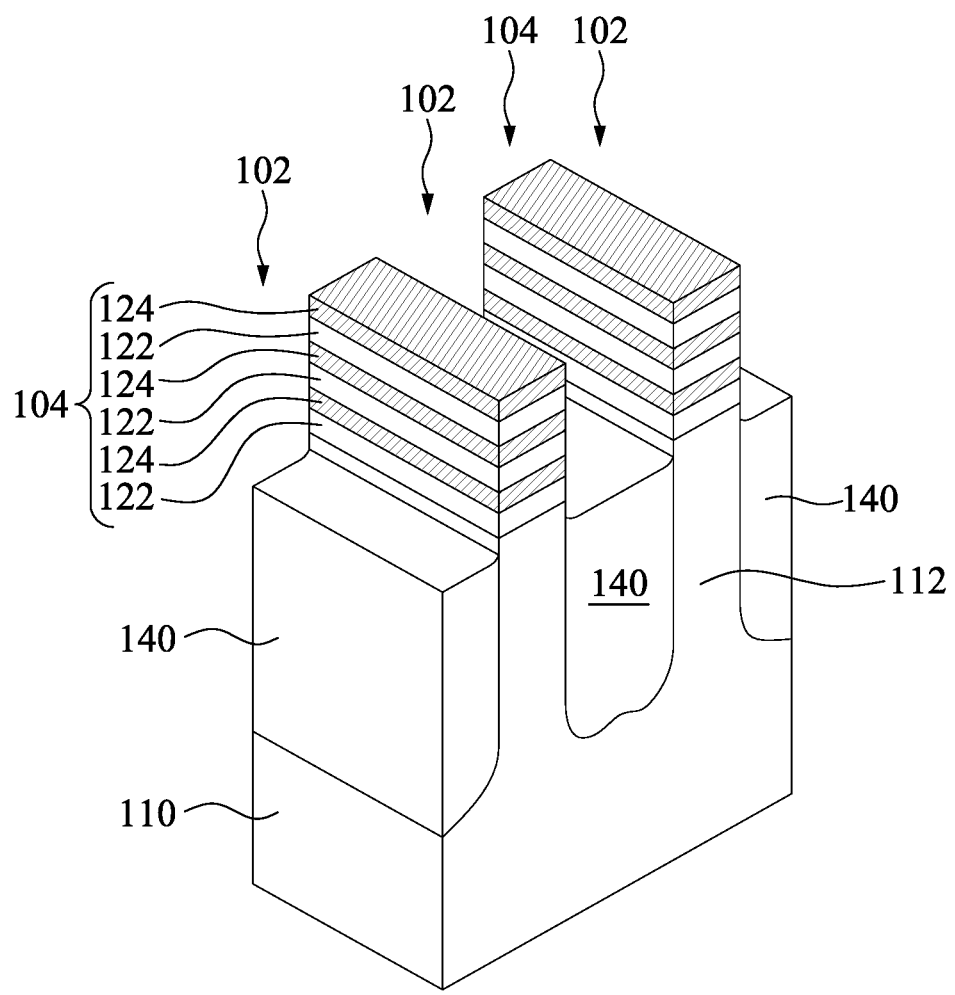

Reference is made to FIG. 2. The semiconductor stack 120 and the substrate 110 of FIG. 1 are patterned using the patterned hard mask 130 as a mask to form trenches 102. Accordingly, a plurality of fin structures (or semiconductor strips) 104 are formed. The trenches 102 extend into the substrate 110 and have lengthwise directions substantially parallel to each other. The trenches 102 form base portions 112 in the substrate 110, where the base portions 112 protrude from the substrate 110, and the fin structures 104 are respectively formed above the base portions 112 of the substrate 110. The remaining portions of the semiconductor stack 120 are accordingly referred to as the fin structures 104 alternatively.

Isolation structures 140, which may be shallow trench isolation (STI) regions, are formed in the trenches 102. The formation may include filling the trenches 102 with a dielectric layer(s), for example, using flowable chemical vapor deposition (FCVD), and performing a chemical mechanical polish (CMP) to level the top surface of the dielectric material with the top surface of the topmost semiconductor layer 124. The isolation structures 140 are then recessed. The top surface of the resulting isolation structures 140 may be level with or slightly lower than the top surface of the base portions 112 of the substrate 110. The isolation structures 140 may be a dielectric material, such as silicon oxide, silicon nitride, silicon oxynitride, SiCN, $SiC_xO_yN_z$, or combinations thereof.

Figure 3:
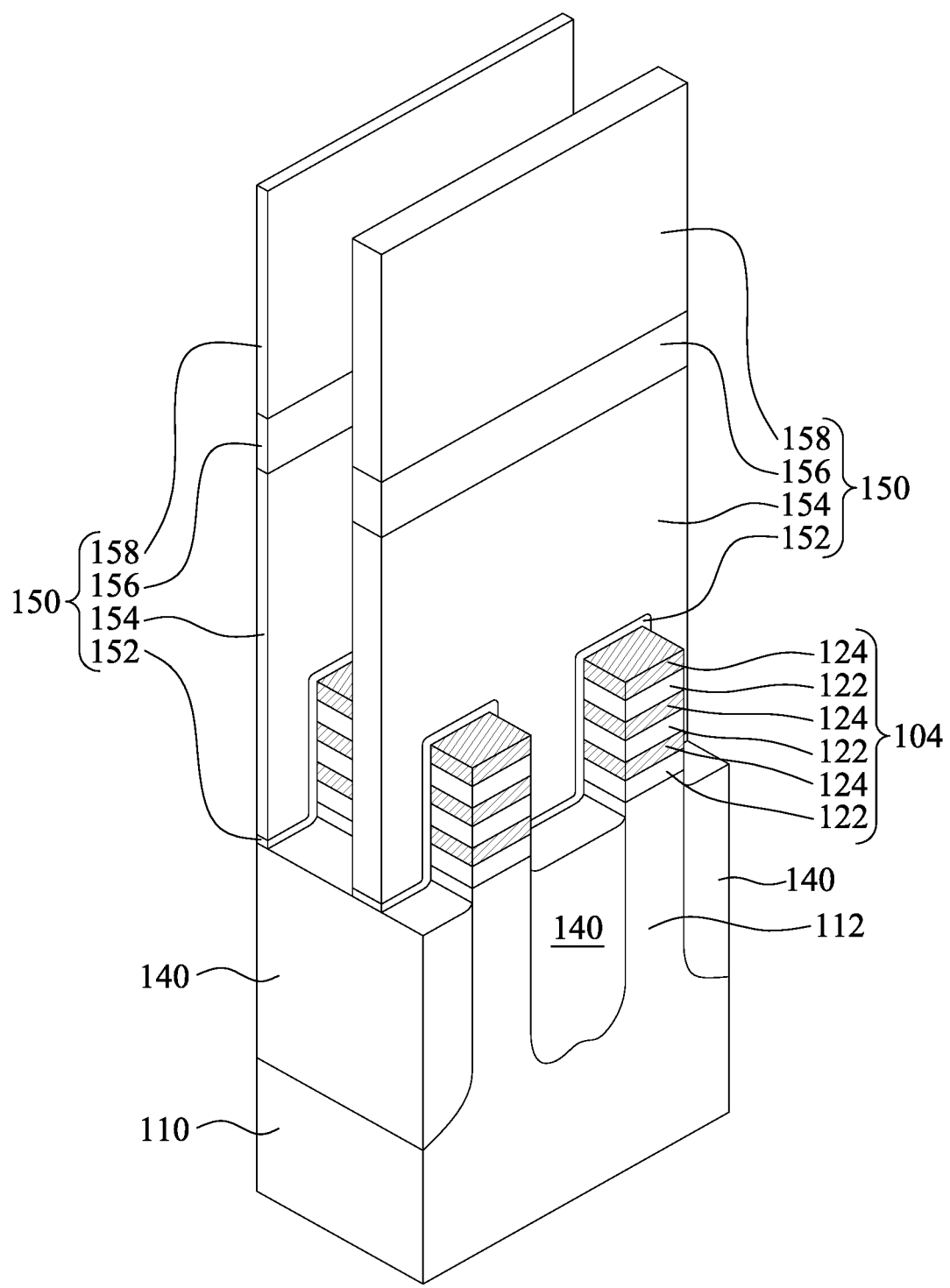

Reference is made to FIG. 3. Dummy gate structures 150 are formed over the substrate 110 and are at least partially disposed over the fin structures 104. The portions of the fin structures 104 underlying the dummy gate structures 150 may be referred to as the channel region. The dummy gate structures 150 may also define source/drain (S/D) regions of the fin structures 104, for example, the regions of the fin structures 104 adjacent and on opposing sides of the channel regions.

Dummy gate formation operation first forms a dummy gate dielectric layer 152 over the fin structures 104. Subsequently, a dummy gate electrode layer 154 and a hard mask which may include multiple layers 156 and 158 (e.g., a nitride layer 156 and an oxide layer 158) are formed over the dummy gate dielectric layer 152. The hard mask is then patterned, followed by patterning the dummy gate electrode layer 152 by using the patterned hard mask as an etch mask. In some embodiments, after patterning the dummy gate electrode layer 154, the dummy gate dielectric layer 152 is removed from the S/D regions of the fins 104. The etch process may include a wet etch, a dry etch, and/or a combination thereof. The etch process is chosen to selectively etch the dummy gate dielectric layer 152 without substantially etching the fin structures 104, the dummy gate electrode layer 154, the nitride mask layer 156 and the oxide mask layer 158.

Figure 4:
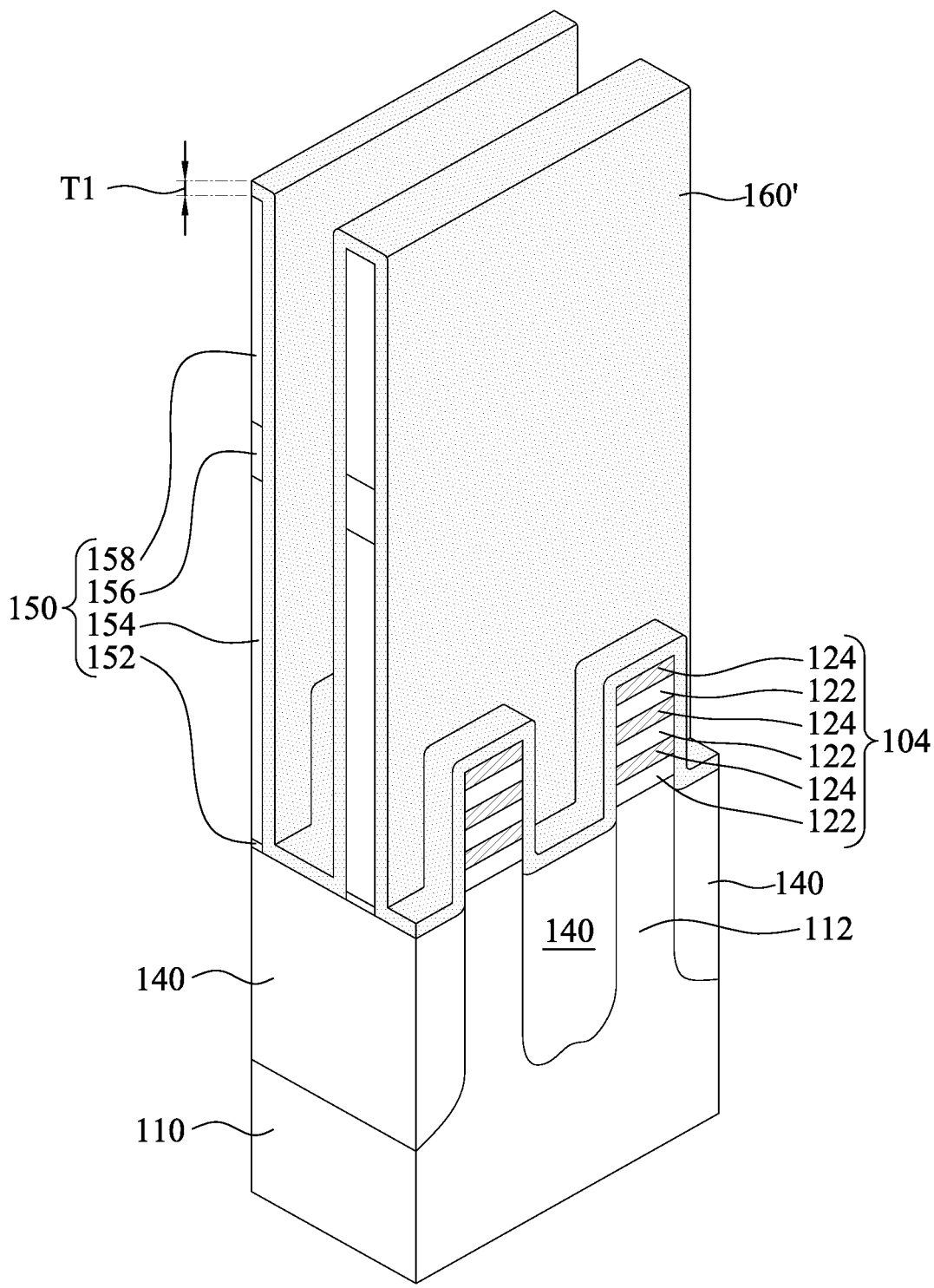

After formation of the dummy gate structures 150 is completed, gate spacers 162 (see FIGS. 6A and 6C) are formed on sidewalls of the dummy gate structures 150. Specifically, as shown in FIG. 4, a first dielectric film 160' is deposited on the structure as illustrated in FIG. 3. The first dielectric film 160' may be silicon nitride (SiN), silicon carbonoxide (SiCO), silicon carbonnitride (SiCN), silicon oxycarbonnitride (SiOCN), or the like. The first dielectric film 160' is formed conformally on the substrate 110, the dummy gate structures 150, and the fin structures 104. The first dielectric film 160' has a substantially uniform thickness T1 in a direction orthogonal to a corresponding underlying surface, which may be in a range of about 1 nm to about 10 nm.

The first dielectric film 160' is formed using a deposition technique that can form conformal dielectric layers, such as thermal atomic layer deposition (ALD), plasma-enhanced (PE) ALD, pulsed PEALD, or atomic layer chemical vapor deposition (AL-CVD). ALD is an approach to filling dielectrics that involves depositing a monolayer of precursor over the substrate 110, purging the chamber, and introducing a reactant that reacts with the precursor to leave a monolayer of product. The cycle can be repeated many times to build a layer with a sufficient thickness to be functional. In some embodiments, the first dielectric film 160' is formed by performing m cycles of the first deposition process to achieve a desired thickness, where m is equal to or greater than 1.

During the deposition processes, the structure is positioned on a chuck in a deposition process chamber. A vacuum is then applied to the deposition process chamber to remove oxygen and moisture and the temperature is raised to an acceptable level that is suitable for the deposition. Precursors are then fed into the deposition process chamber. The precursors may be silicon-containing precursors such as dichlorosilane (DCS), SiH$_4$, or other suitable materials.

In some embodiments, process gases are fed into the ALD process chamber. The process gas can be a nitride-containing gas, such as NH$_3$, N$_2$/H$_2$, or other suitable gases. Hence, the first dielectric film 160' further includes nitride, and is a nitride-containing dielectric layer. In some other embodiments, the nitride-containing gas and oxygen-containing gas, such as O$_2$, H$_2$O, and/or other suitable gases (e.g., carbon-containing materials), are sequentially fed into the ALD process chamber to modulate the N/O/C ratio of the first dielectric film 160'. In some embodiments, the ALD processes can be plasma-enhanced ALD processes. That is, the ALD processes include plasma treatments.

Figure 5A:
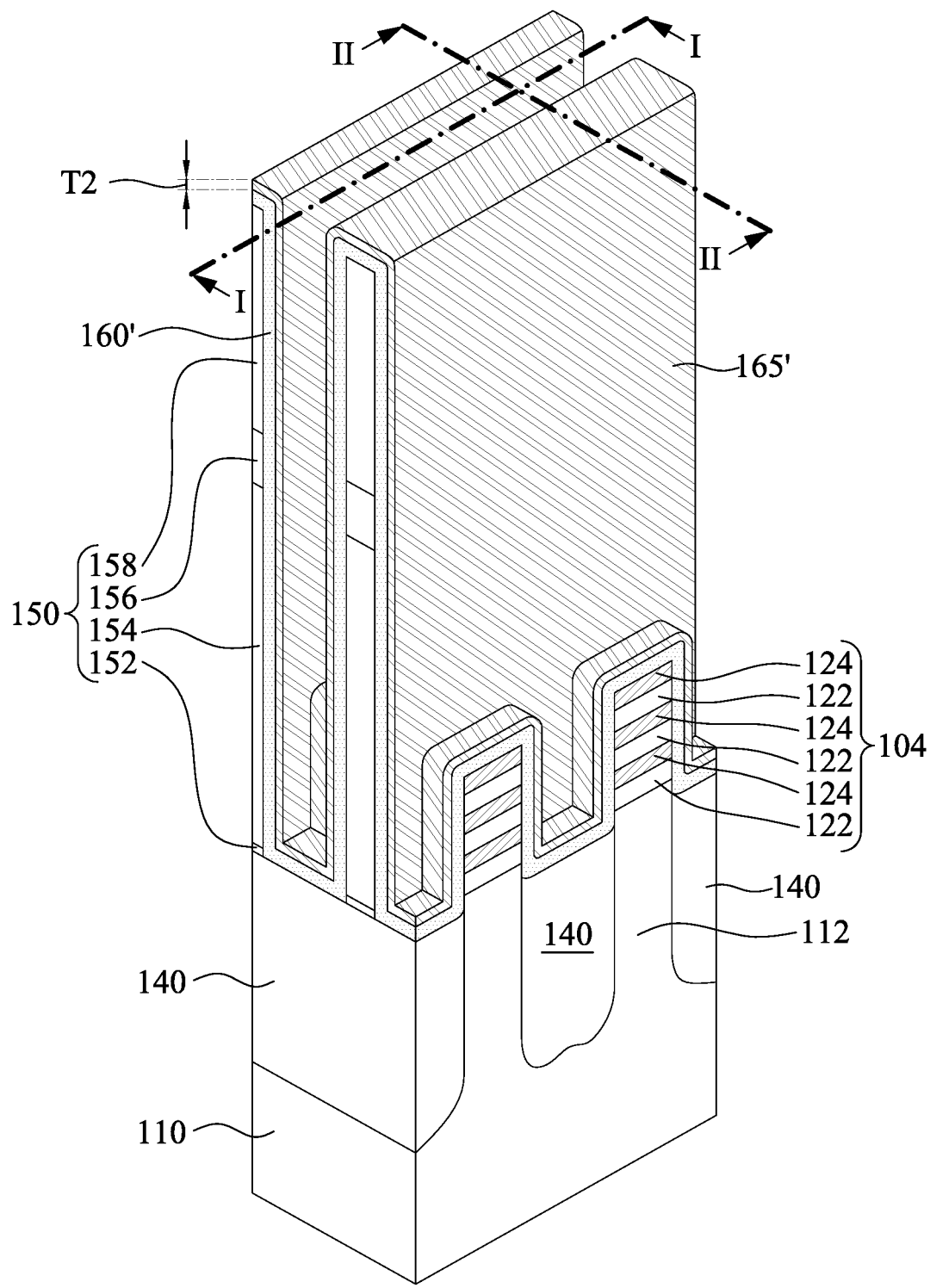
Figure 5B:
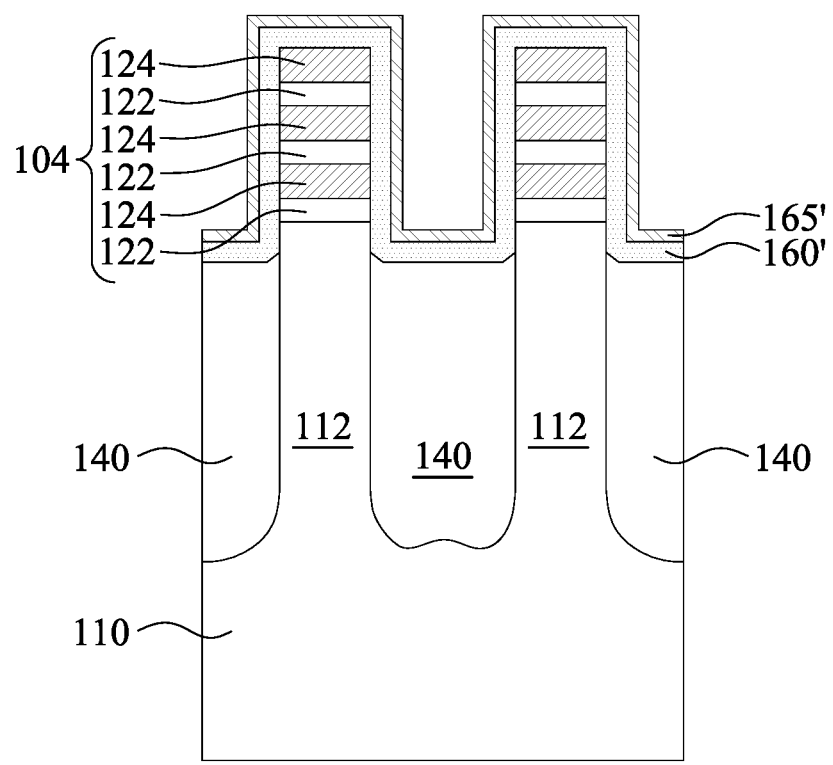
Figure 5C:
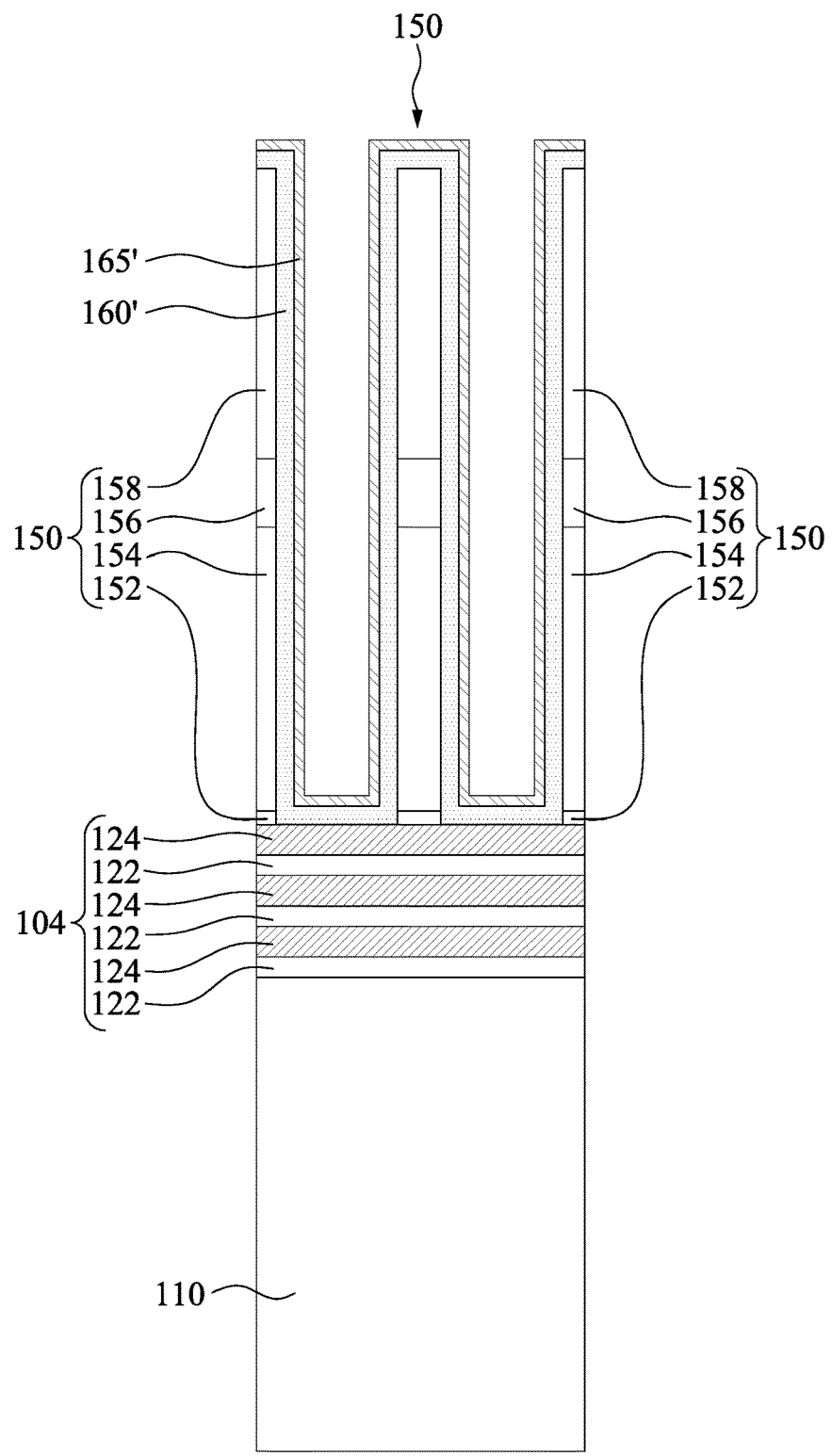

Subsequently, as shown in FIGS. 5A-5C, a second dielectric film 165' is deposited on the structure as illustrated in FIG. 4. The second dielectric film 165' may be silicon nitride (SiN), silicon carbonoxide (SiCO), silicon carbonnitride (SiCN), silicon oxycarbonnitride (SiOCN), or the like. The second dielectric film 165' is formed conformally on first dielectric film 160'. The second dielectric film 165' has a substantially uniform thickness T2 in a direction orthogonal to a corresponding underlying surface, which may be in a range of about 3 nm to about 15 nm.

The second dielectric film 165' is formed using a deposition technique that can form conformal dielectric layers, such as thermal atomic layer deposition (ALD), plasma-enhanced (PE) ALD, pulsed PEALD, or atomic layer chemical vapor deposition (AL-CVD). In some embodiments, the second dielectric film 165' is formed by performing m cycles of the first deposition process to achieve a desired thickness, where m is equal to or greater than 1.

During the deposition processes, precursors are fed into the deposition process chamber. The precursors may be silicon-containing precursors such as dichlorosilane (DCS), SiH$_4$, or other suitable materials. In some embodiments, process gases are fed into the ALD process chamber. The process gas can be a nitride-containing gas, such as NH$_3$, N$_2$/H$_2$, or other suitable gases. Hence, the second dielectric film 165' further includes nitride, and is a nitride-containing dielectric layer. In some other embodiments, the nitride-containing gas and oxygen-containing gas, such as O$_2$, H$_2$O, and/or other suitable gases (e.g., carbon-containing materials), are sequentially fed into the ALD process chamber to modulate the N/O/C ratio of the second dielectric film 165'. In some embodiments, the ALD processes can be plasma-enhanced ALD processes. That is, the ALD processes include plasma treatments.

The first dielectric film 160' and the second dielectric film 165' include different materials. For example, the first dielectric film 160' includes Si$_{(1-x1-y1-z1)}$O$_{x1}$C$_{y1}$N$_{z1}$, and the second dielectric film 165' includes Si$_{(1-x2-y2-z2)}$O$_{x2}$C$_{y2}$N$_{z2}$, where 0≤x1, x2, y1, y2, z1, z2<1, at least one of x1, y1, and z1 is greater than 0, at least one of x2, y2, and z2 is greater than 0, and at least one of the following conditions is (are) satisfied: x1 is not equal to x2, y1 is not equal to y2, and z1 is not equal to z2. For example, in some embodiments, x1 is greater than x2 by about 10% or more (e.g., about 50%), i.e., the oxygen concentration of the first dielectric film 160' is greater than the oxygen concentration of the second dielectric film 165'. In some other embodiments, z1 is greater than z2 by about 10% or more (e.g., about 50%), i.e., the nitrogen concentration of the first dielectric film 160' is greater than the nitrogen concentration of the second dielectric film 165'.

Figure 6A:
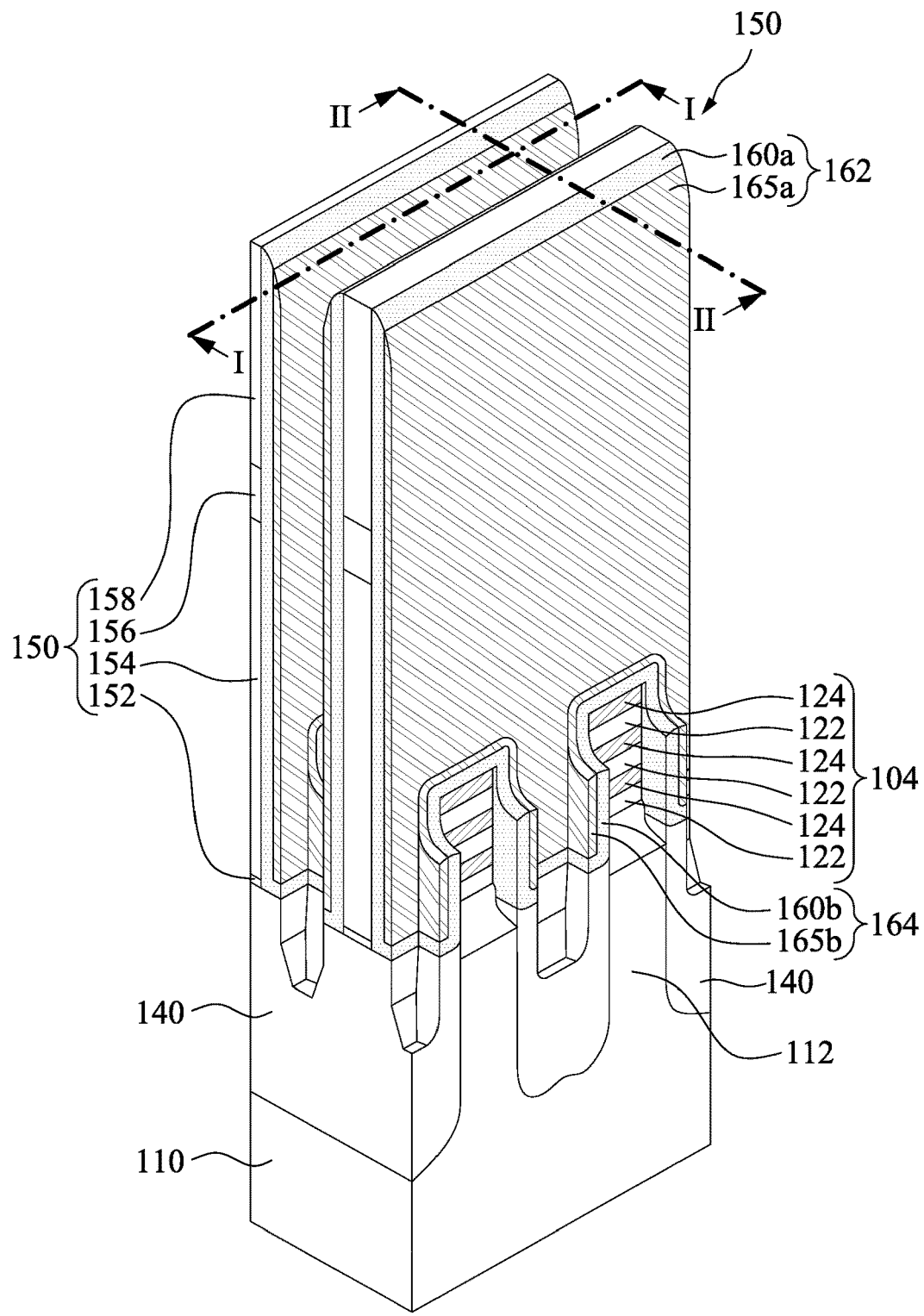
Figure 6B:
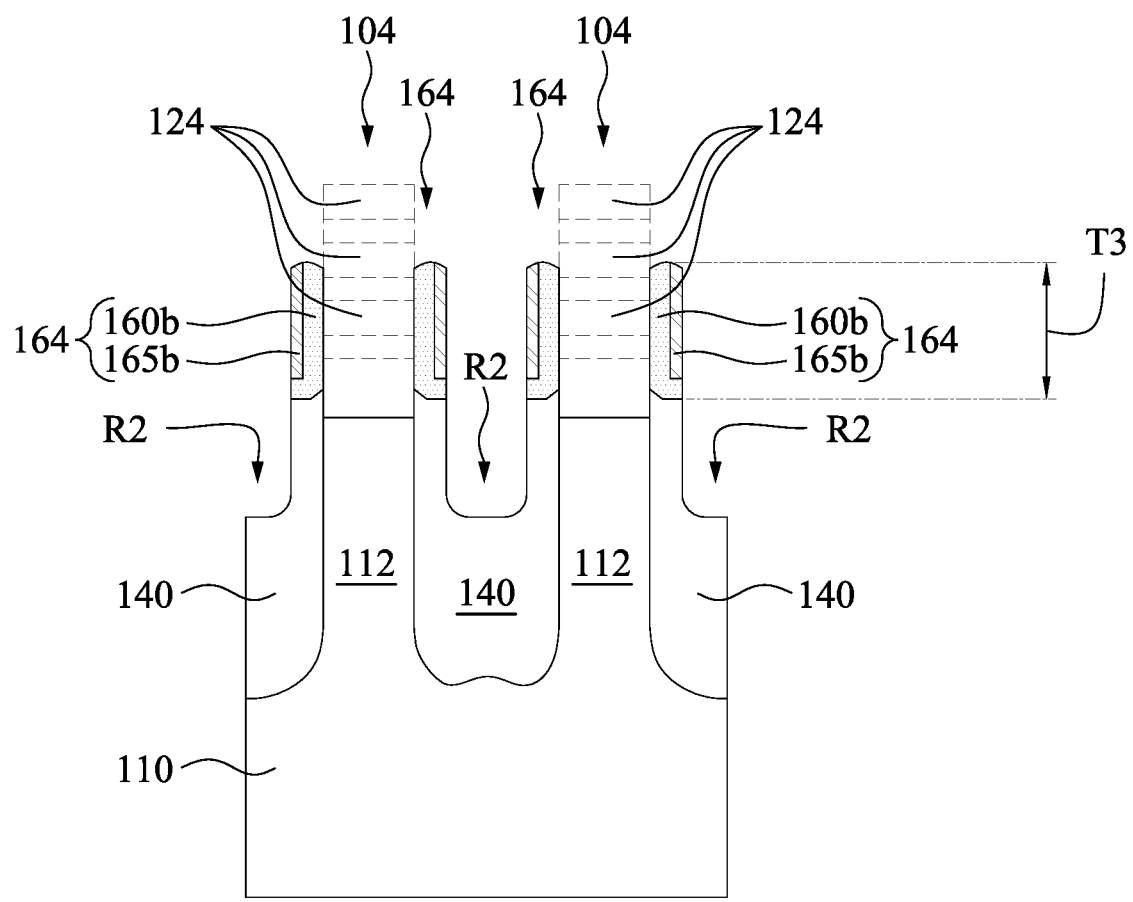
Figure 6C:
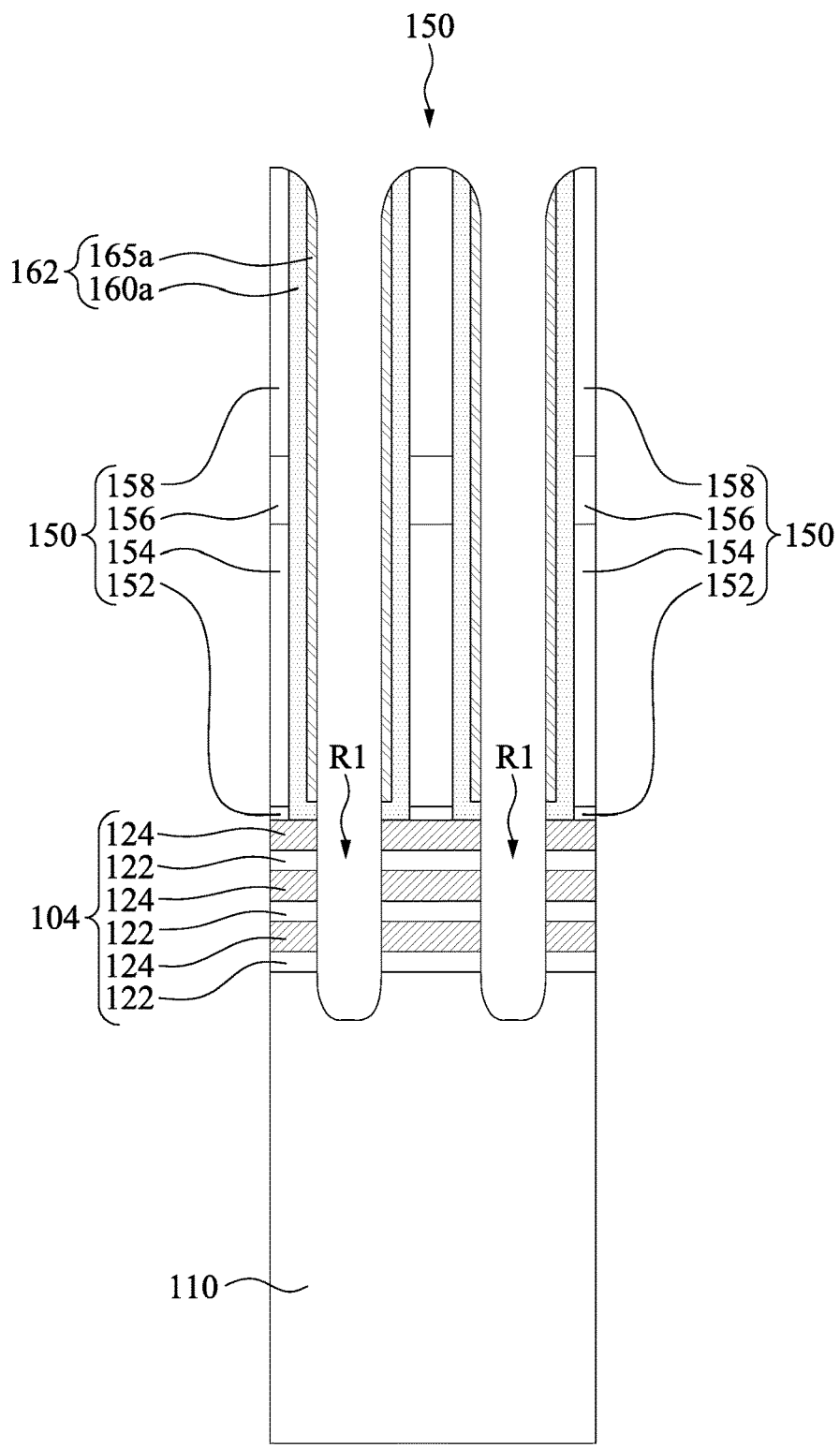

Reference is made to FIGS. 6A-6C. An anisotropic etching process is then performed on the deposited first dielectric film 160' and second dielectric film 165' to expose portions of the fin structures 104 not covered by the dummy gate structure 150 (e.g., in source/drain regions of the fin structures 104). Portions of the dielectric materials directly above the dummy gate structures 150 may be completely removed by this anisotropic etching process. Portions of the dielectric materials on sidewalls of the dummy gate structures 150 may remain, forming gate sidewall spacers, which are denoted as the gate spacers 162, for the sake of simplicity. Each of the gate spacers 162 includes a first dielectric layer 160a (which is a remaining portion of the first dielectric film 160') and a second dielectric layer 165a (which is a remaining portion of the second dielectric film 165').

The anisotropic etching process further etches exposed portions of the fin structures 104 that extend laterally beyond the gate spacers 162 (e.g., in the source/drain regions of the fin structures 104), resulting in recesses R1 into the fin structures 104 and between corresponding dummy gate structures 150. For clarity, the etched semiconductor layers 122 and 124 are denoted by dashed lines in the cut I-I cross-sectional views. After the anisotropic etching, end surfaces of the semiconductor layers 122 and 124 are aligned with respective outermost sidewalls of the gate spacers 162, due to the anisotropic etching. In some embodiments, the base portions 112 are also recessed as shown in FIGS. 6A-6C. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Further, sidewall spacers 164, which are remaining parts of the first dielectric film 160' and second dielectric film 165' that are not removed in the operation of the anisotropic etching process, exist. Specifically, when the first dielectric film 160' and second dielectric film 165' are etched to form the gate spacers 162, portions of the first dielectric film 160' and second dielectric film 165' on sidewalls of the fin structures 104 are pullback-etched. Portions of the first dielectric film 160' and second dielectric film 165' thus remain at corners between the isolation structure 140 and the fin structures 104 after the etching and form the sidewall spacers 164. Each of the sidewall spacers 164 includes a first dielectric layer 160b (which is another remaining portion of the first dielectric film 160') and a second dielectric layer 165b (which is another remaining portion of the second dielectric film 165') outside the first dielectric layer 160b. The vertical thickness T3 of the sidewall spacers 164 is in a range of about 5 nm to about 30 nm in some embodiments. In some embodiments, the isolation structures 140 are recessed to form recesses R2 when the anisotropic etching process is performed.

Figure 7A:
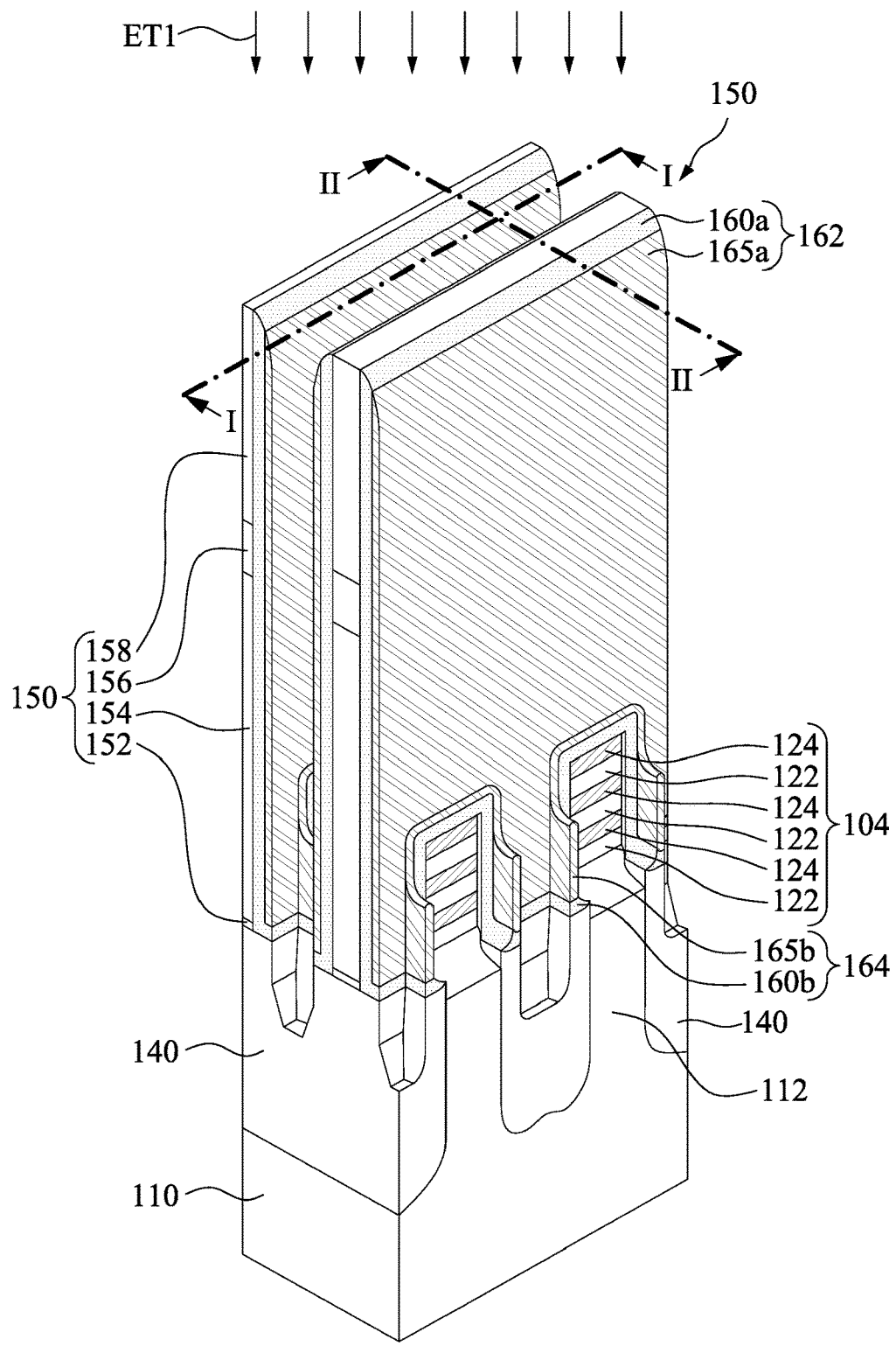
Figure 7B:
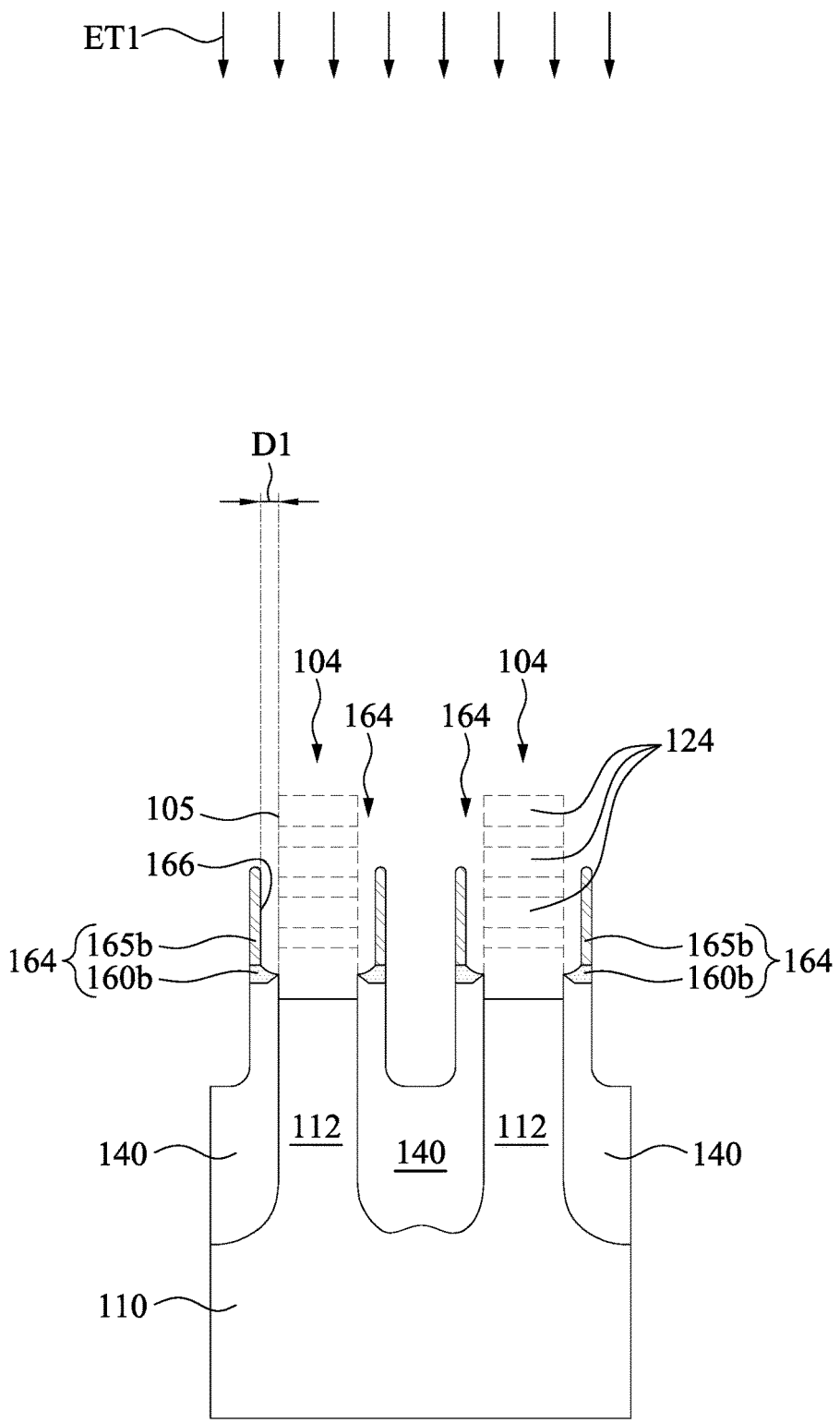
Figure 7C:
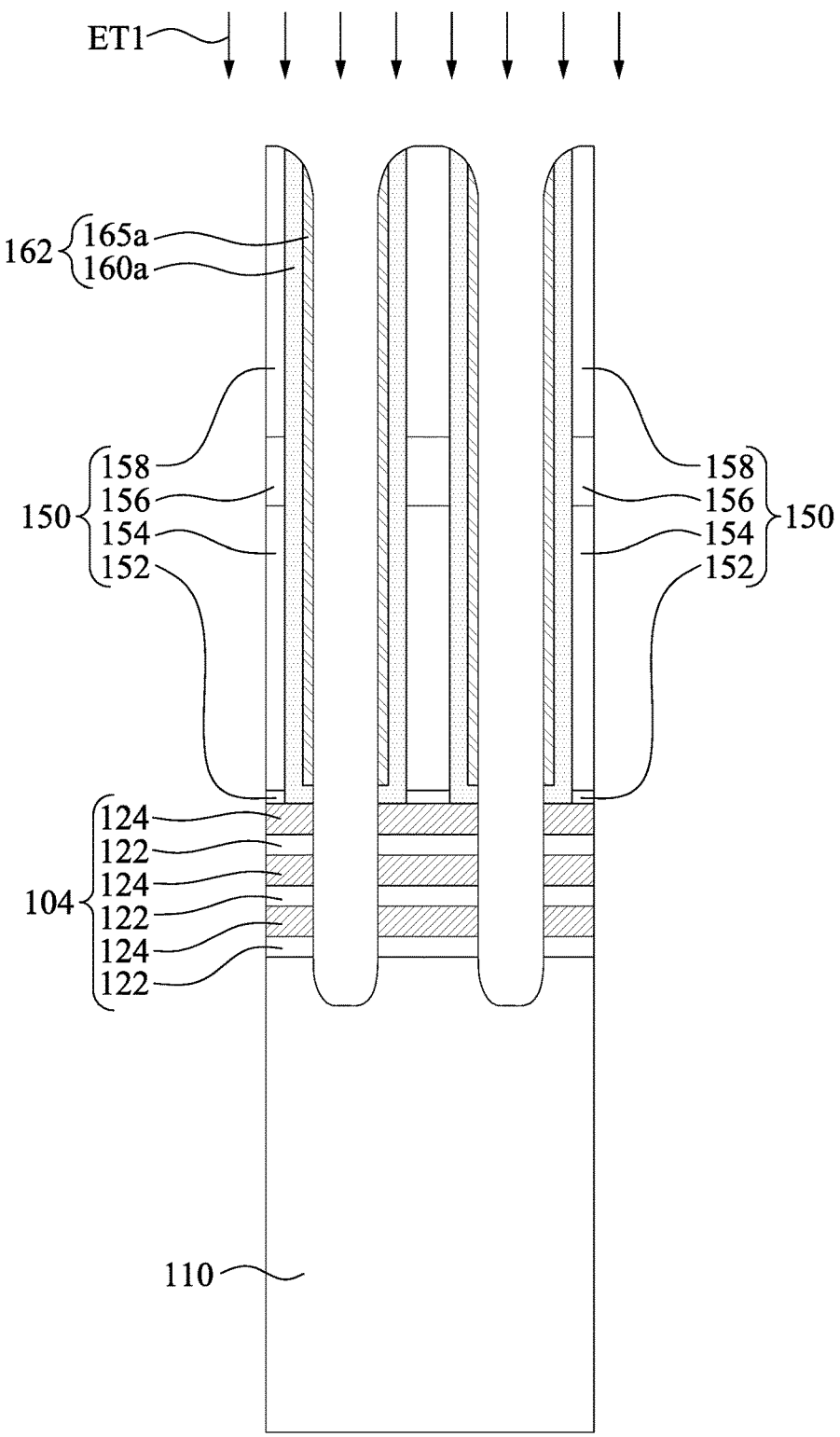

Reference is made to FIGS. 7A-7C. the first dielectric layers 160b of the sidewall spacers 164 are etched back by using an etching process (also called pullback etching process) ET1. In some embodiments, the etching process ET1 is an anisotropic etching process, such as a plasma etching. Take plasma etching for example, the substrate 110 having the structure illustrated in FIGS. 6A-6C is loaded into a plasma tool and exposed to a plasma environment generated by RF or microwave power in a gaseous mixture of a fluorine containing gas, such as $CH_3F$, $CHF_3$ or similar species, an inert gas, such as argon or helium, for a duration time sufficient to etch the first dielectric layers 160b.

In some embodiments, the foregoing etching gas and etching conditions of the etching process ET1 are selected in such a way that second dielectric layers 165b exhibits a slower etch rate than the first dielectric layers 160b. For example, when the etching gas is $CH_3F$, the etching process ET1 etches the first dielectric layer 160b having a high nitrogen concentration at a faster etch rate than etches the second dielectric layer 165b having a low nitrogen concentration (i.e., z1 is greater than z2); when the etching gas is $CHF_3$, the etching process ET1 etches the first dielectric layer 160b having a high oxygen concentration at a faster etch rate than etches the second dielectric layer 165b having a low oxygen concentration (i.e., x1 is greater than x2). In this way, the second dielectric layers 165b is not or barely etched during the etching process ET1.

After the etching process ET1, the sidewall spacers 164 each has a wide bottom (i.e., the remaining portion of the first dielectric layer 160b) and a thin top (i.e., the second dielectric layer 165b), thereby enlarging a window for accommodating spacer residues and for growing source/drain epitaxial structures, which will be described below. As shown in FIG. 7B, inner sidewalls 166 of the second dielectric layers 160b are exposed, and a distance D1 between the inner sidewall 166 and a sidewall 105 of the fin structure 104 is in a range of about 1 nm to about 10 nm.

Figure 8A:
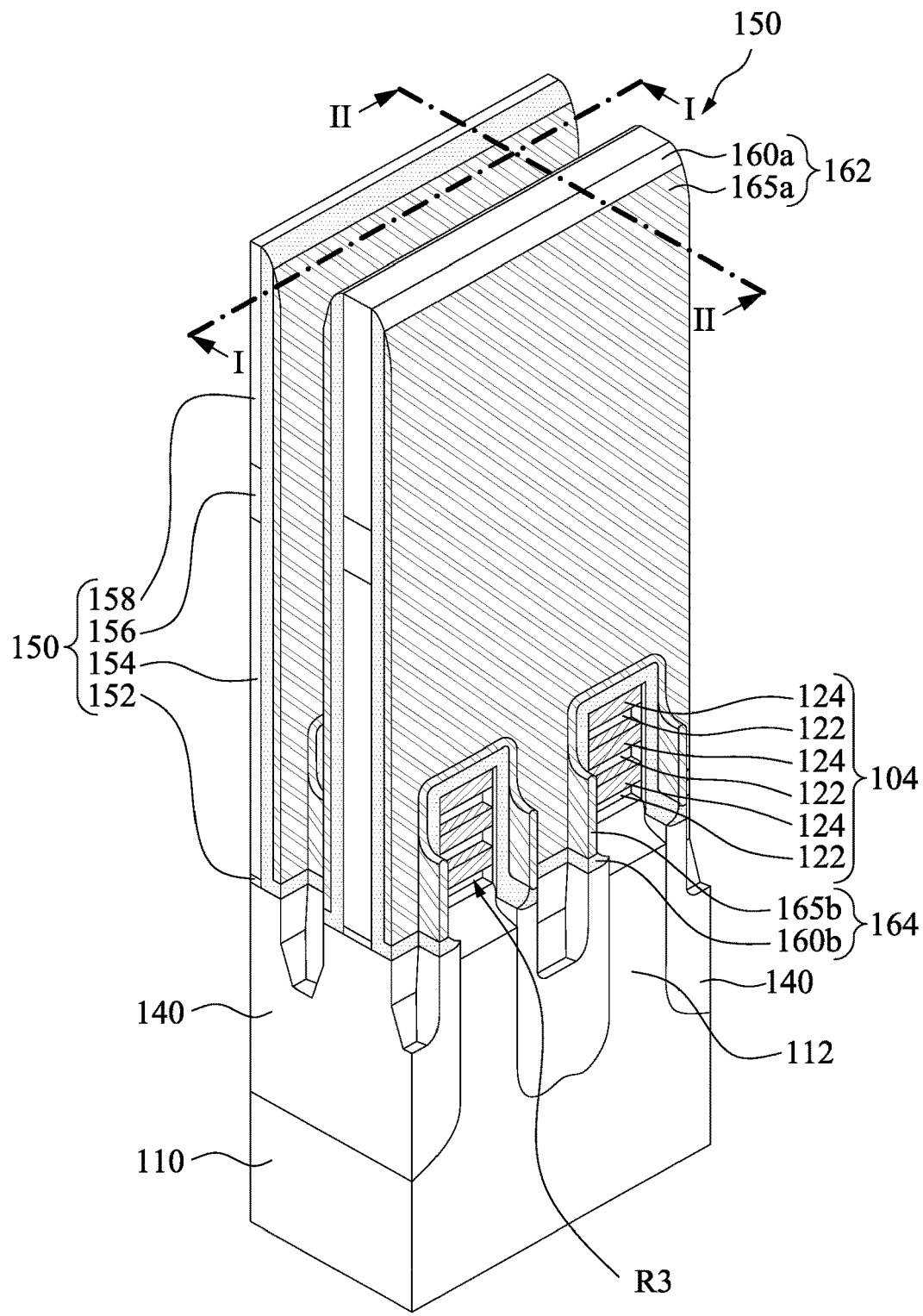
Figure 8B:
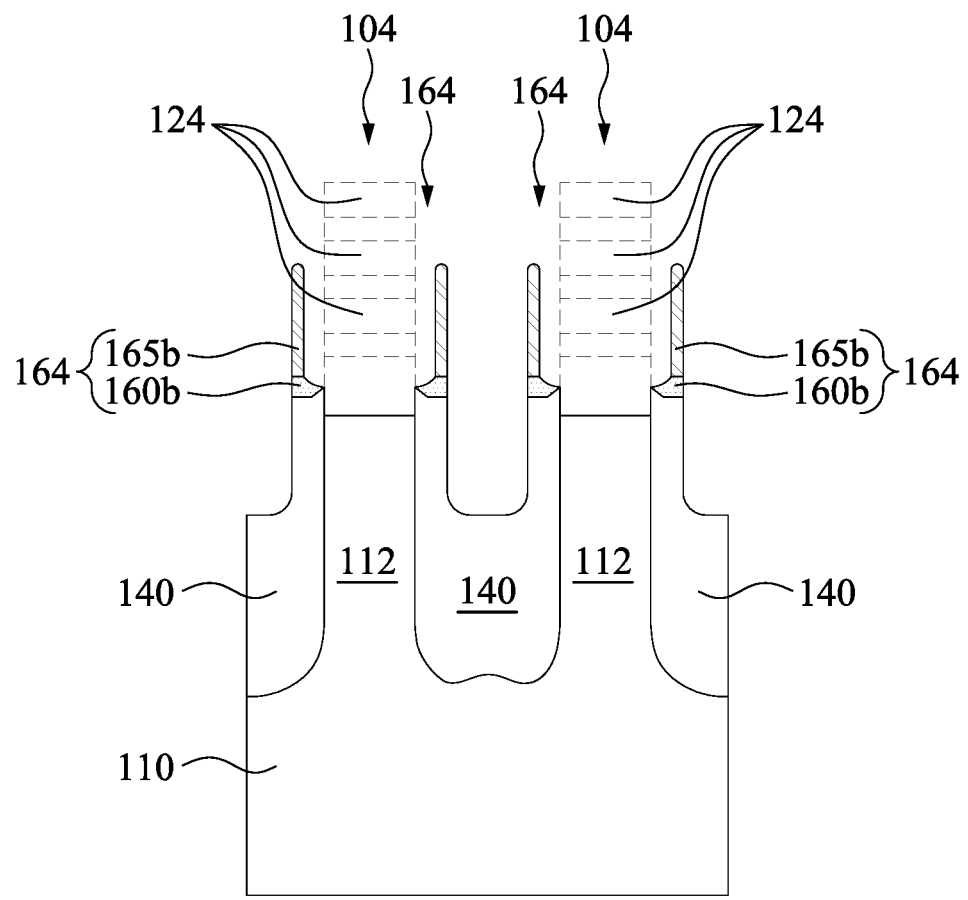
Figure 8C:
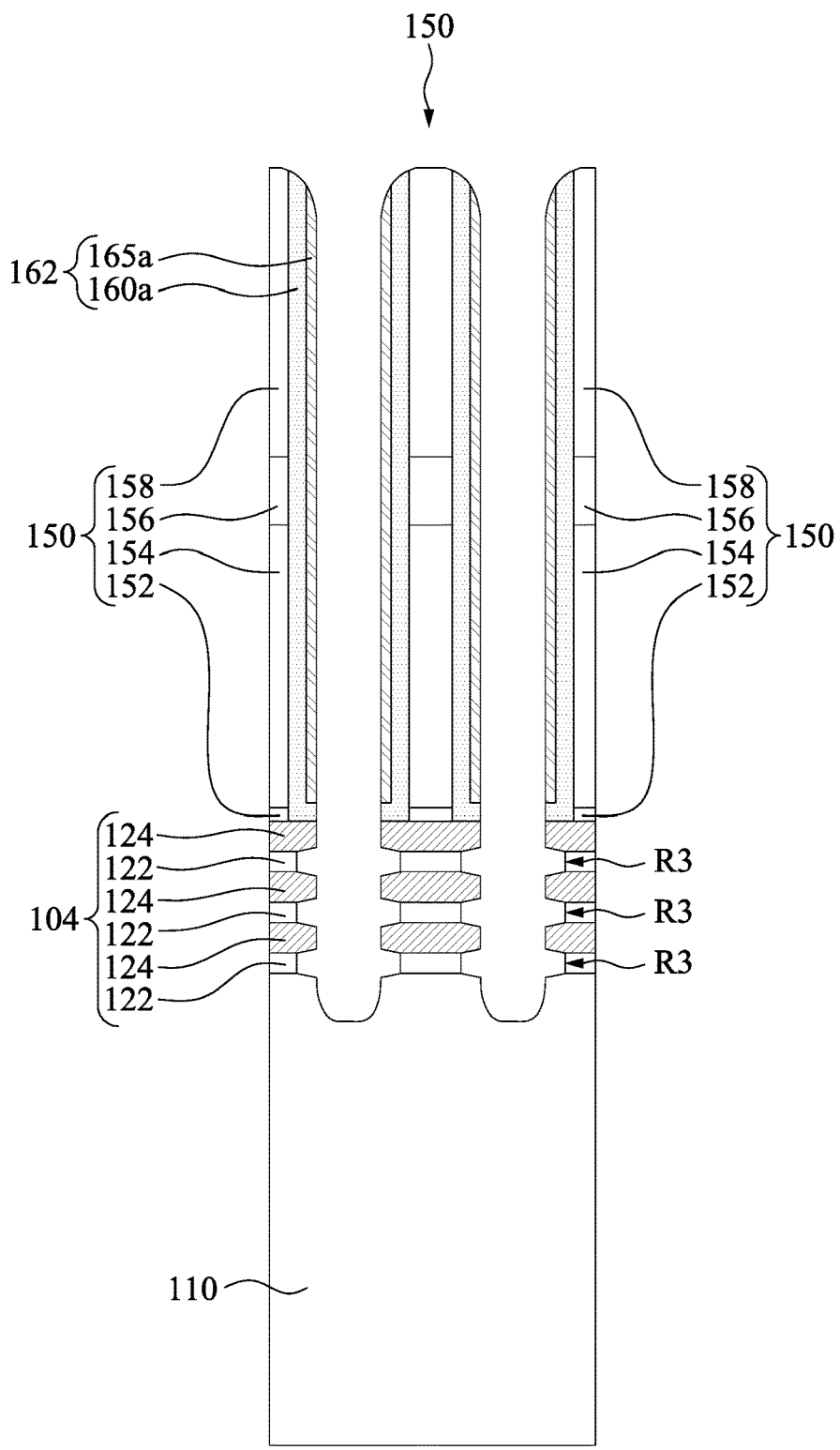

Reference is made to FIGS. 8A-8C. The semiconductor layers 122 are laterally or horizontally recessed by using suitable etch techniques, resulting in lateral recesses R3 each vertically between corresponding semiconductor layers 124. This operation may be performed by using a selective etching process. By way of example and not limitation, the semiconductor layers 122 are SiGe and the semiconductor layers 124 are silicon allowing for the selective etching of the semiconductor layers 122. In some embodiments, the selective wet etching includes an APM etch (e.g., ammonia hydroxide-hydrogen peroxide-water mixture) that etches SiGe at a faster etch rate than it etches Si. As a result, the semiconductor layers 124 laterally extend past opposite end surfaces of the semiconductor layers 122.

Figure 9A:
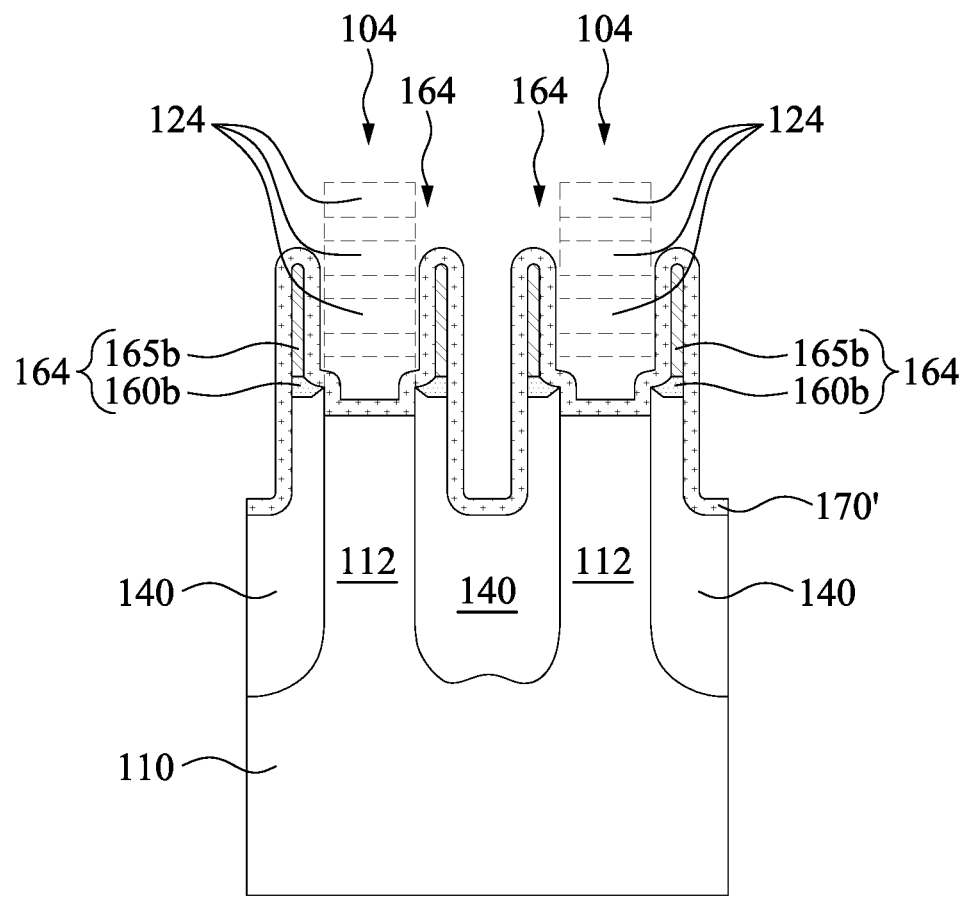
Figure 9B:
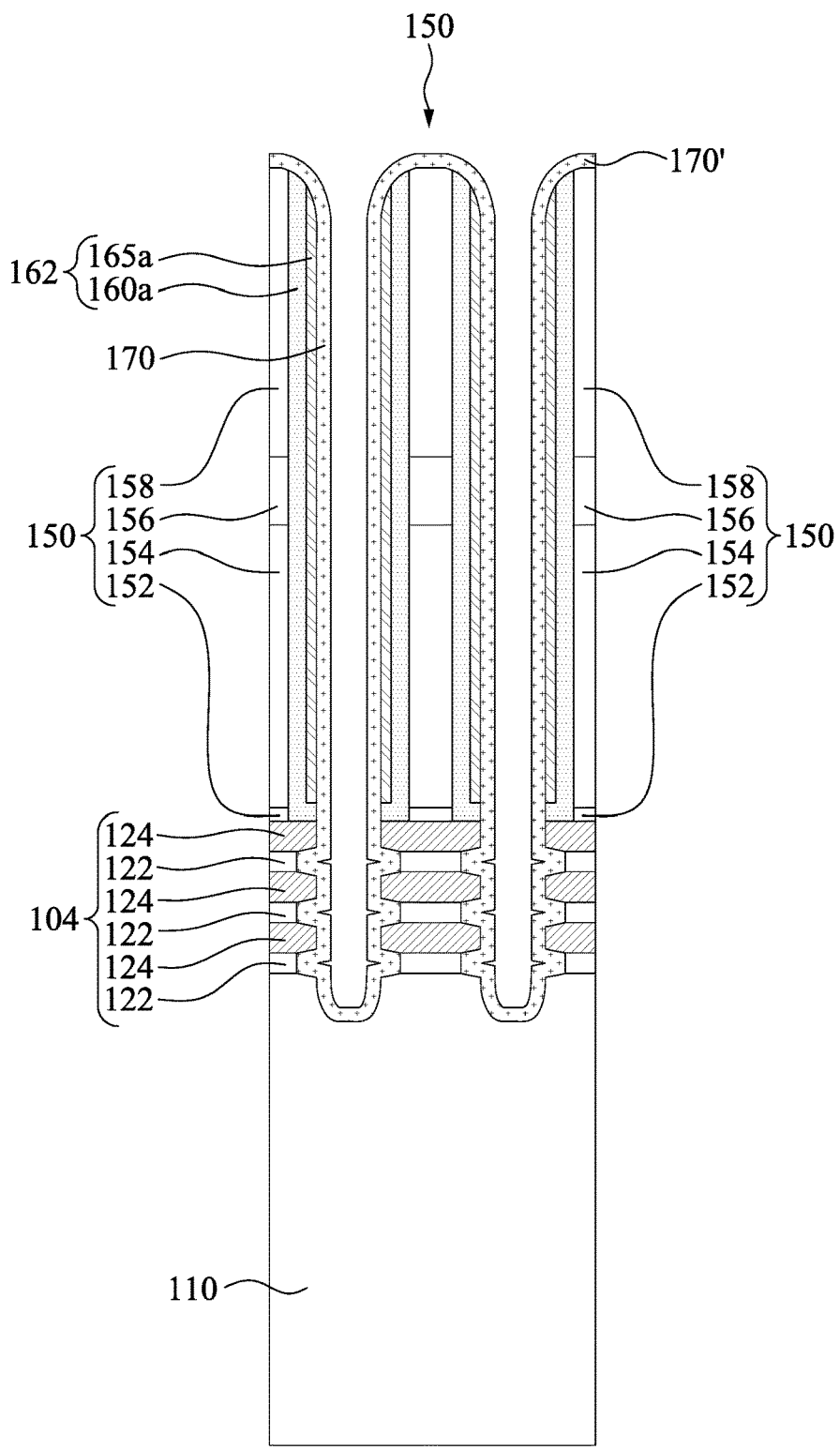

Reference is made to FIGS. 9A-9B. Inner spacer material layers 170' are formed to fill the recesses R3 left by the lateral etching of the semiconductor layers 122 discussed above with reference to FIGS. 8A-8C. Portions of the inner spacer material layers 170' are deposited over the sidewall spacers 164 as well as shown in FIG. 9A. The inner spacer material layer 170' may be a low-k dielectric material, such as $SiO_2$, silicon nitride (SiN), silicon carbonoxide (SiCO), silicon carbonnitride (SiCN), silicon oxycarbonnitride (SiOCN). In some embodiments, the inner spacer material layer 170' is intrinsic or un-doped with impurities. The inner spacer material layer 170' can be formed using CVD, including LPCVD and PECVD, PVD, ALD, or other suitable processes.

In some embodiments, the inner spacer material layers 170' has a material different from the material of the second dielectric layers 165b. For example, the inner spacer material layers 170' includes $Si_{(1-x3-y3-z3)}O_{x3}C_{y3}N_{z3}$, where $0 \leq x3$, $y3$, $z3<1$, at least one of x3, y3, and z3 is greater than 0, and at least one of the following conditions: x3 is not equal to x2, y3 is not equal to y2, and z3 is not equal to z2 is (are) satisfied.

Figure 10A:
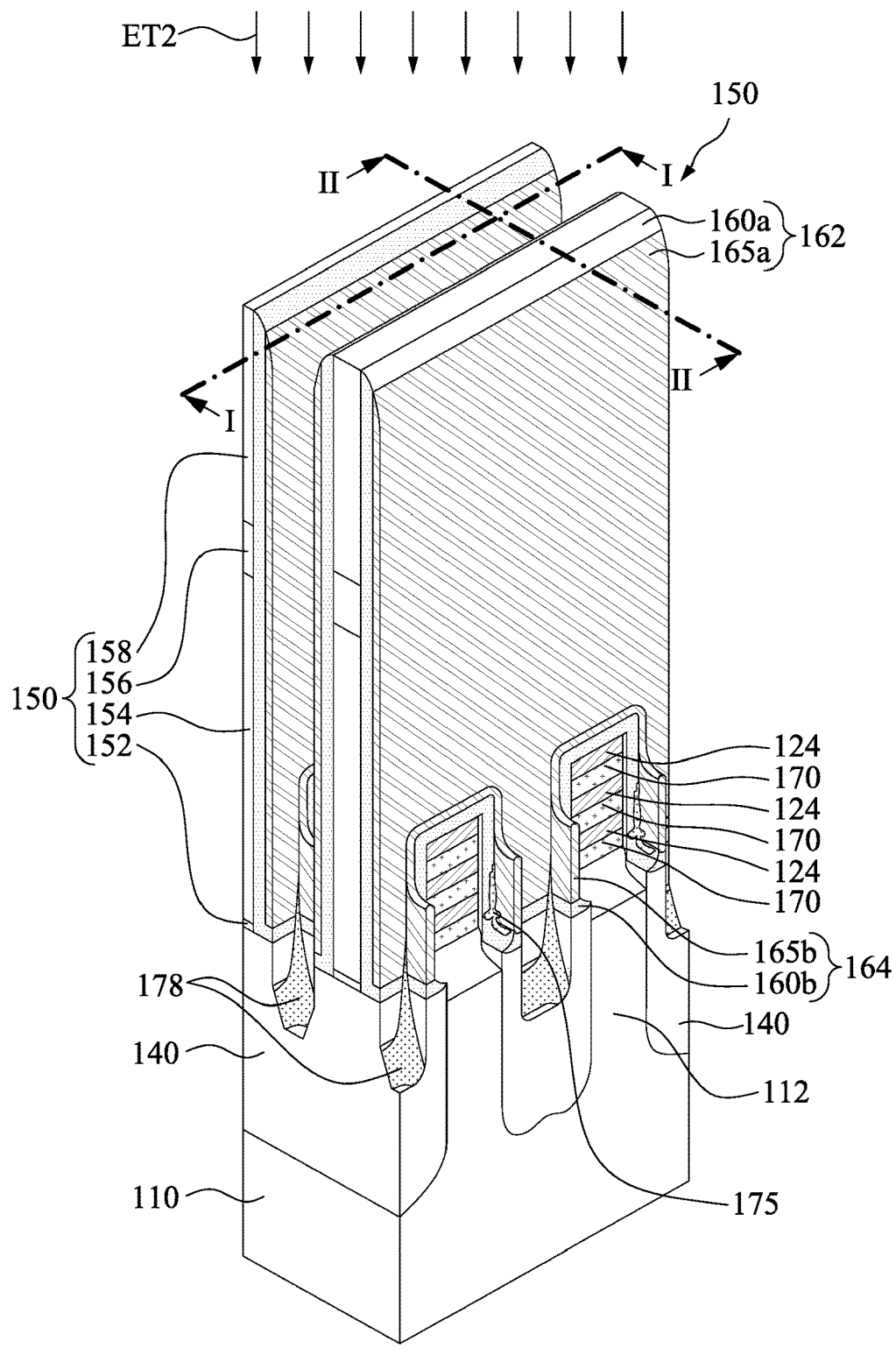
Figure 10B:
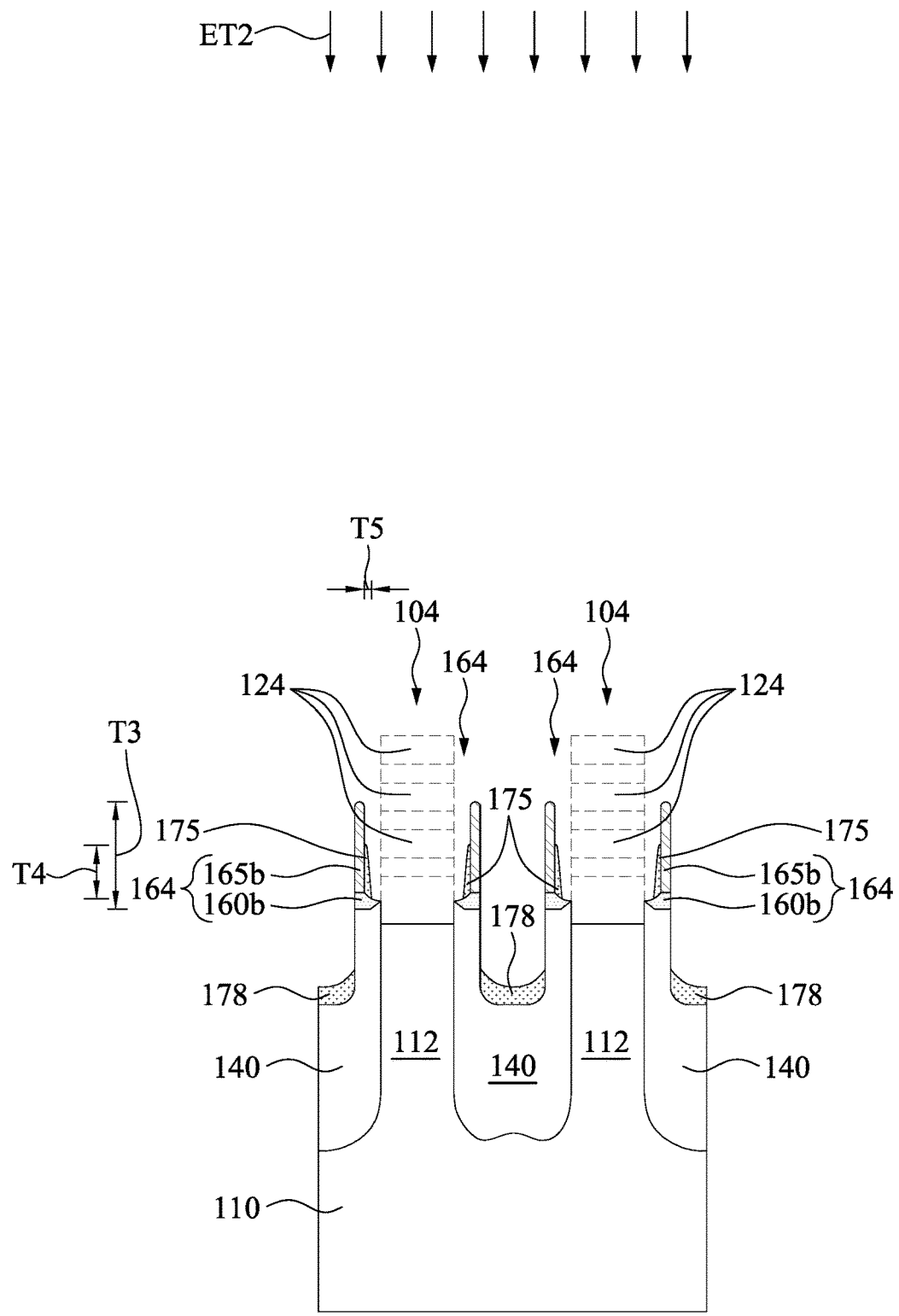
Figure 10C:
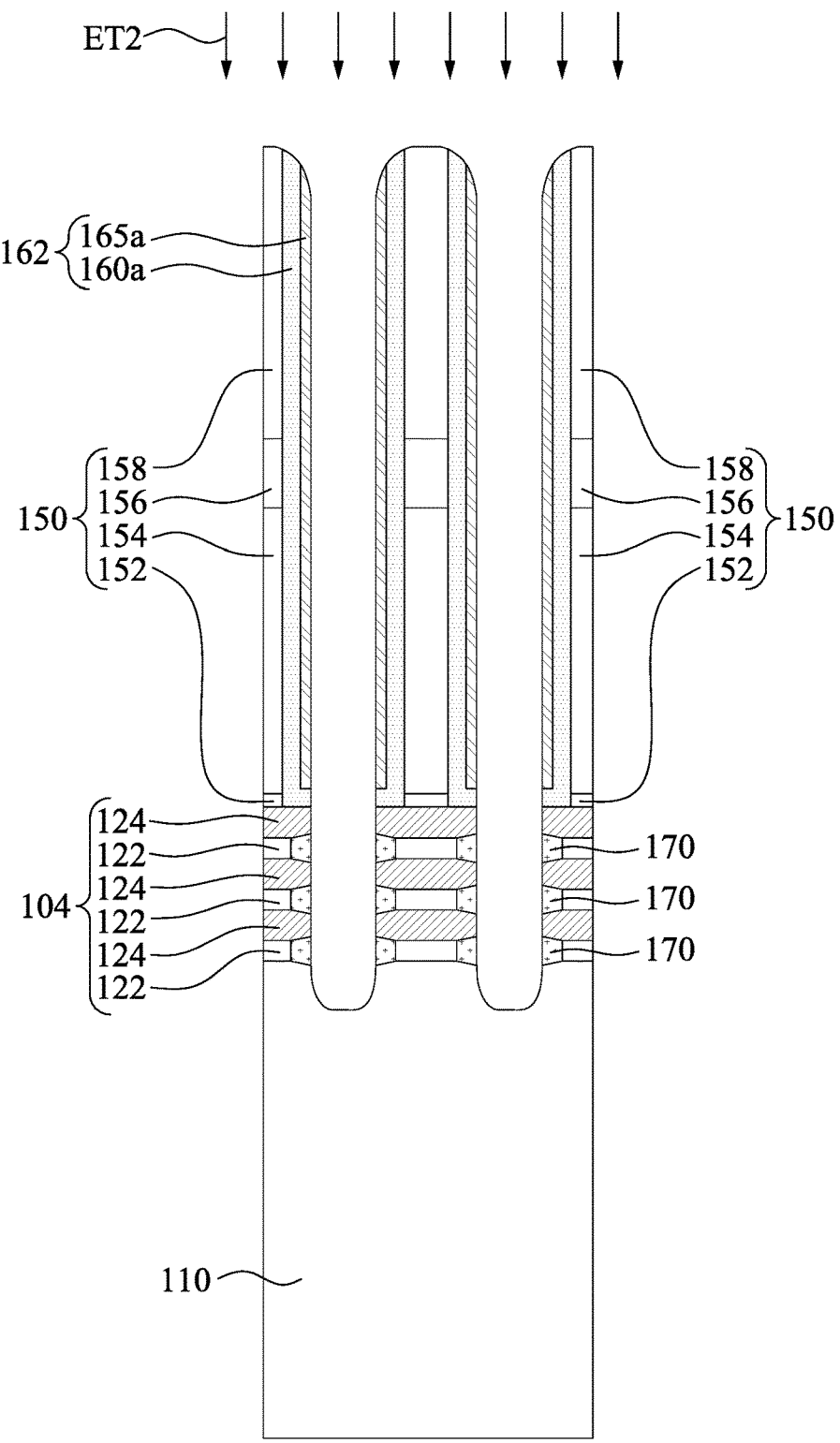

Reference is made to FIGS. 10A-10C. After the deposition of the inner spacer material layer 170', an anisotropic etching process ET2 is performed to trim the deposited inner spacer material layer 170', such that portions of the deposited inner spacer material layer 170' that fill the recesses R3 left by the lateral etching of the semiconductor layers 122 are left. After the trimming process, the remaining portions of the deposited inner spacer material are denoted as inner spacers 170 in the recesses R3 for the sake of simplicity. The inner spacers 170 serve to isolate metal gates from source/drain epitaxial structures formed in subsequent processing. In the example of FIG. 10C, sidewalls of the inner spacers 170 are substantially aligned with sidewalls of the channel layers 124.

During the operation of the anisotropic etching process ET2, portions of the inner spacer material layer 170' may remain in different recesses. For example, as shown in FIGS. 10A and 10B, some portions of the inner spacer material layer 170', which are denoted as spacer residues 175, remain at the corners of the first dielectric layer 160b and the second dielectric layer 165b. As shown in FIG. 10B, given to the extra space formed between the second dielectric layer 165b and the fin structure 104, the spacer residues 175 are spaced apart from the semiconductor layers 124, which are served as channel layers of the semiconductor device. That is, the spacer residues 175 do not cover or block the exposed sidewalls of the semiconductor layers 124. In some embodiments, a vertical thickness T4 of the spacer residue 175 is smaller than the vertical thickness T3 of the sidewall spacer 164, and a lateral thickness T5 of the spacer residue 175 is smaller than about 5 nm. In some embodiments, still some portions of the inner spacer material layer 170', which are denoted as spacer residues 178, remain in the recesses R2 (labeled in FIG. 6B).

Figure 11A:
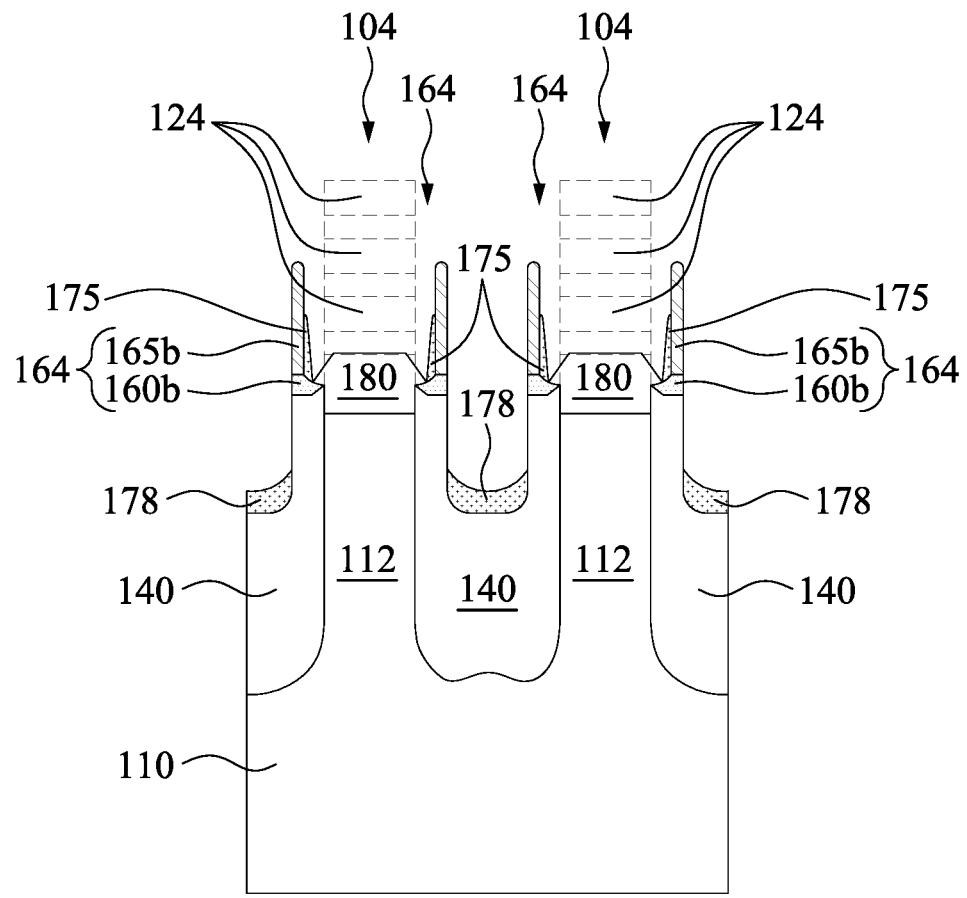
Figure 11B:
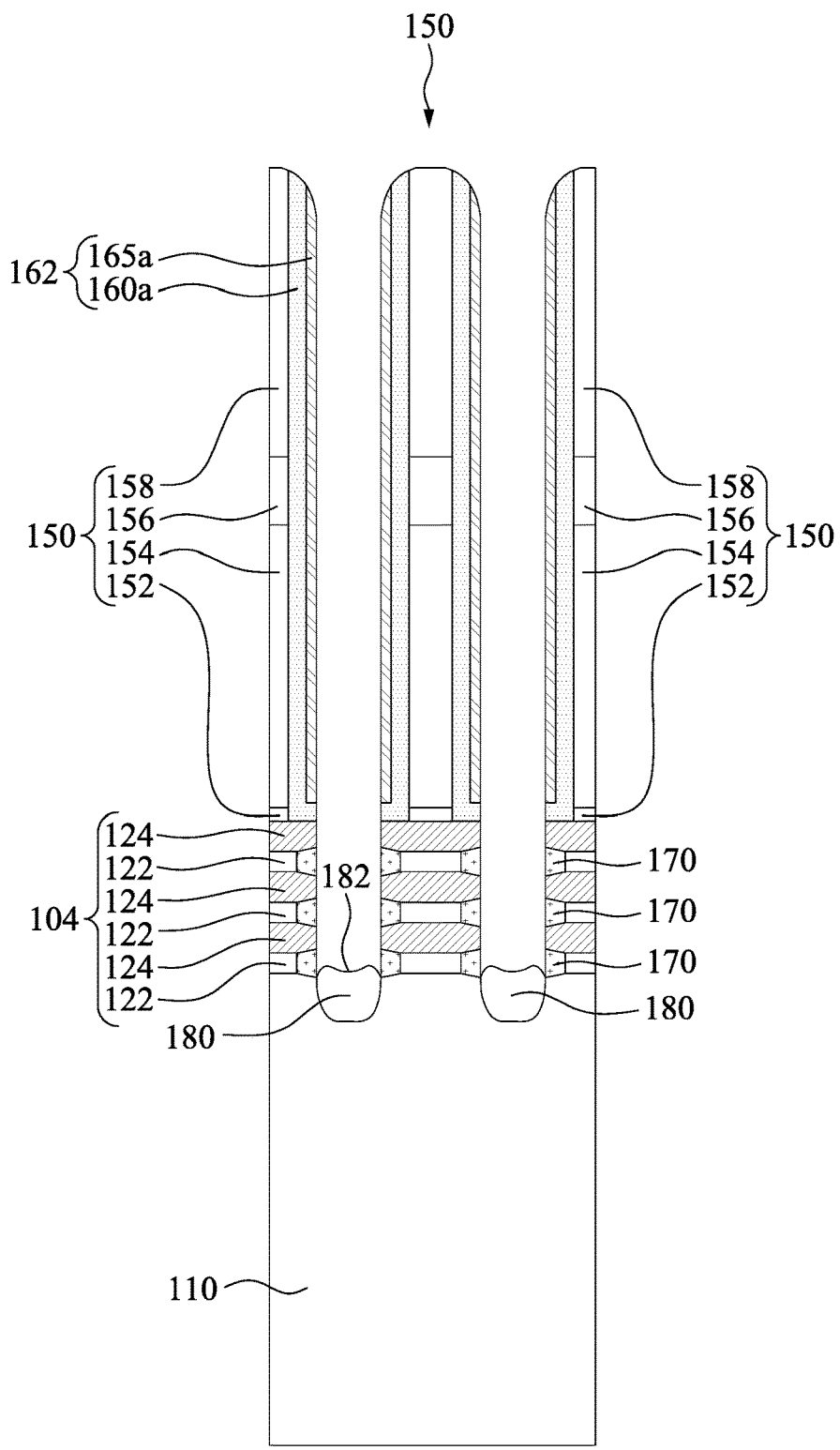

Reference is made to FIGS. 11A and 11B. Bottom source/drain epitaxial structures 180 are respectively formed on the base portions 112 of the substrate 110. In some embodiments, semiconductor materials are deposited on the base portions 112 to form the bottom source/drain epitaxial structures 180. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The bottom source/drain epitaxial structures 180 have suitable crystallographic orientations (e.g., a (100), (110), or (111) crystallographic orientation). The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, the bottom source/drain epitaxial structures 180 are intrinsic. That is, the bottom source/drain epitaxial structures 180 are undoped. The undoped bottom source/drain epitaxial structures 180 are benefit for reducing current leakage from top source/drain epitaxial structures 185 (see FIGS. 12A and 12B) to the substrate 110.

The top surfaces 182 of the bottom source/drain epitaxial structures 180 may be level with the top surface of the base portions 112, or may be at an intermediate level between the top surface and the bottom surface of the bottommost bottom-most semiconductor layer 122. Further, as shown in FIG. 11A, the bottom source/drain epitaxial structures 180 are in contact with the first spacer layer 160b (and the spacer residues 175, if exist).

Figure 12A:
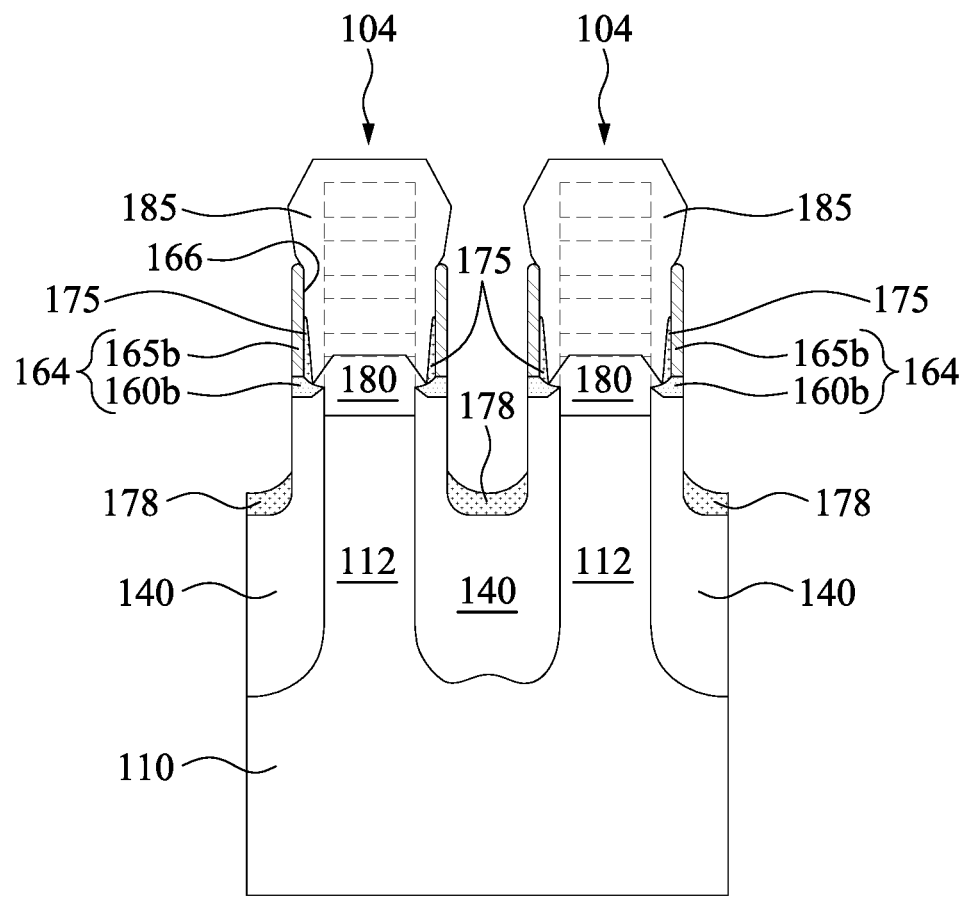
Figure 12B:
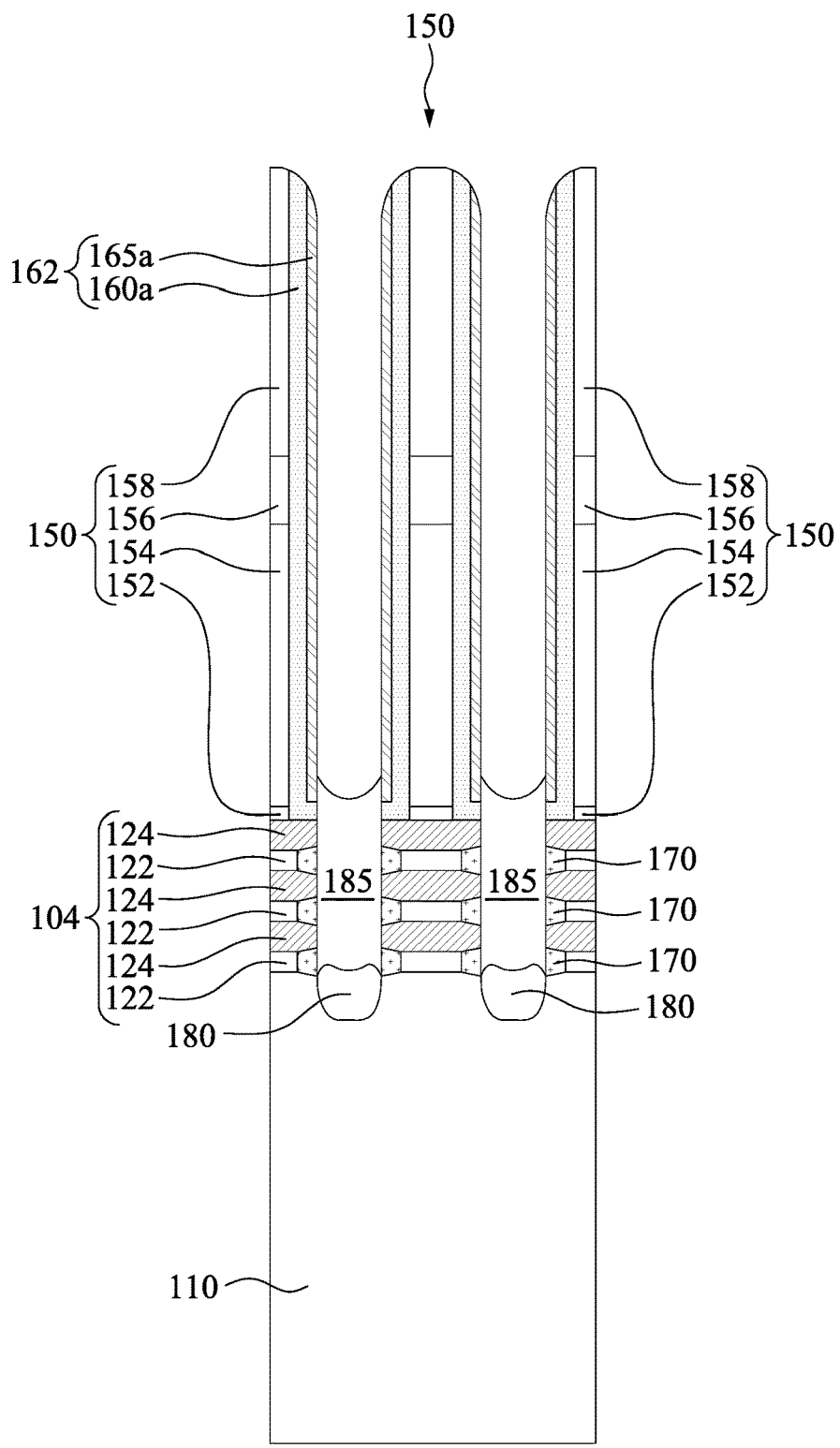

Reference is made to FIGS. 12A and 12B. Top source/drain epitaxial structures 185 are respectively formed on the bottom source/drain epitaxial structures 180. In some embodiments, semiconductor materials are deposited on the source/drain epitaxial structures 180 to form the top source/drain epitaxial structures 185. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The top source/drain epitaxial structures 185 have suitable crystallographic orientations (e.g., a (100), (110), or (111) crystallographic orientation). In some embodiments, where an N-type device is desired, the top source/drain epitaxial structures 185 may include an epitaxially grown silicon phosphorus (SiP) or silicon carbon (SiC). In some embodiments, where a P-type device is desired, the top source/drain epitaxial structures 185 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

The sidewall spacers 164 are configured to limit the space for epitaxially growing the top source/drain epitaxial structures 185. As a result, the top source/drain epitaxial structures 185 are confined between the sidewall spacers 164. This can be used to produce any desirable size of the top source/drain epitaxial structures 185, particularly small top source/drain epitaxial structures 185 for reducing parasitic capacitances. In some embodiments, as shown in FIG. 12A, the top source/drain epitaxial structures 185 is in contact with the inner sidewalls 166 of the second spacer layer 165b of the sidewall spacers 164 and the spacer residues 175 (if exist). Further, the top source/drain epitaxial structures 185 may be spaced apart from the first spacer layer 160b.

Figure 13A:
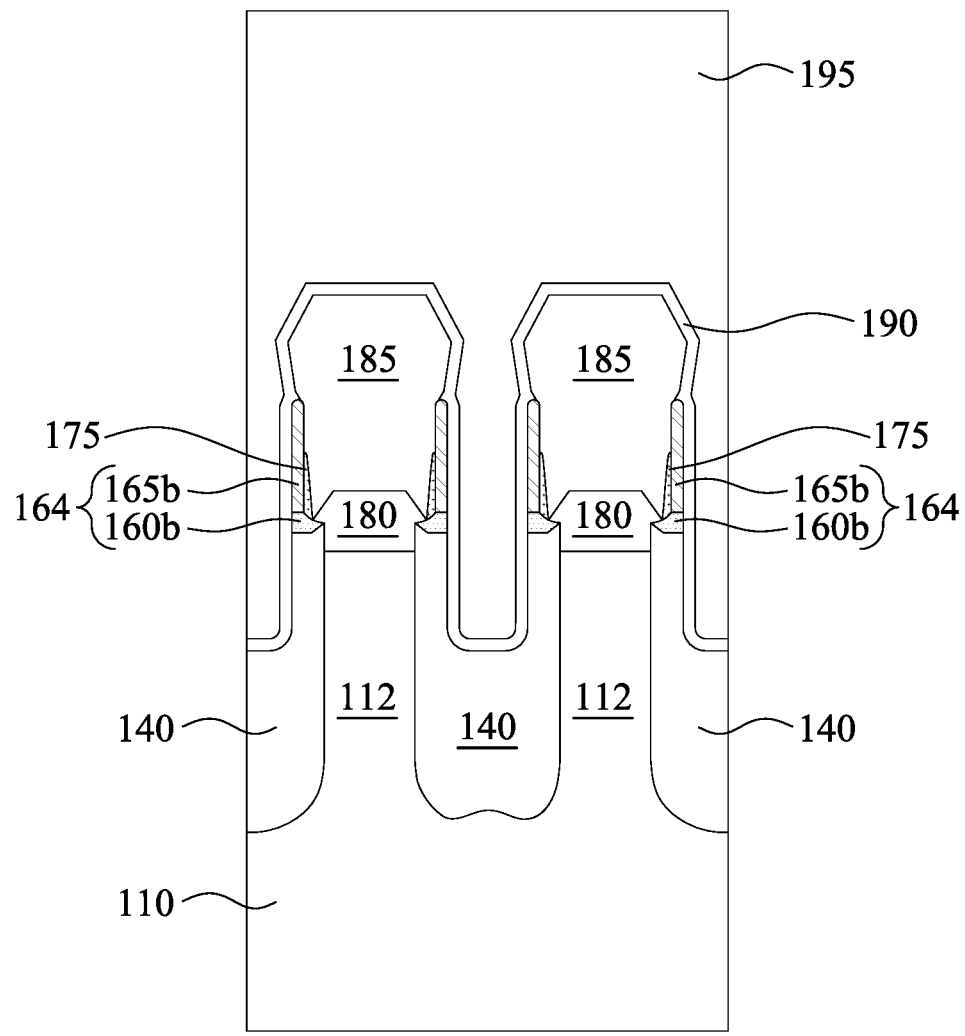
Figure 13B:
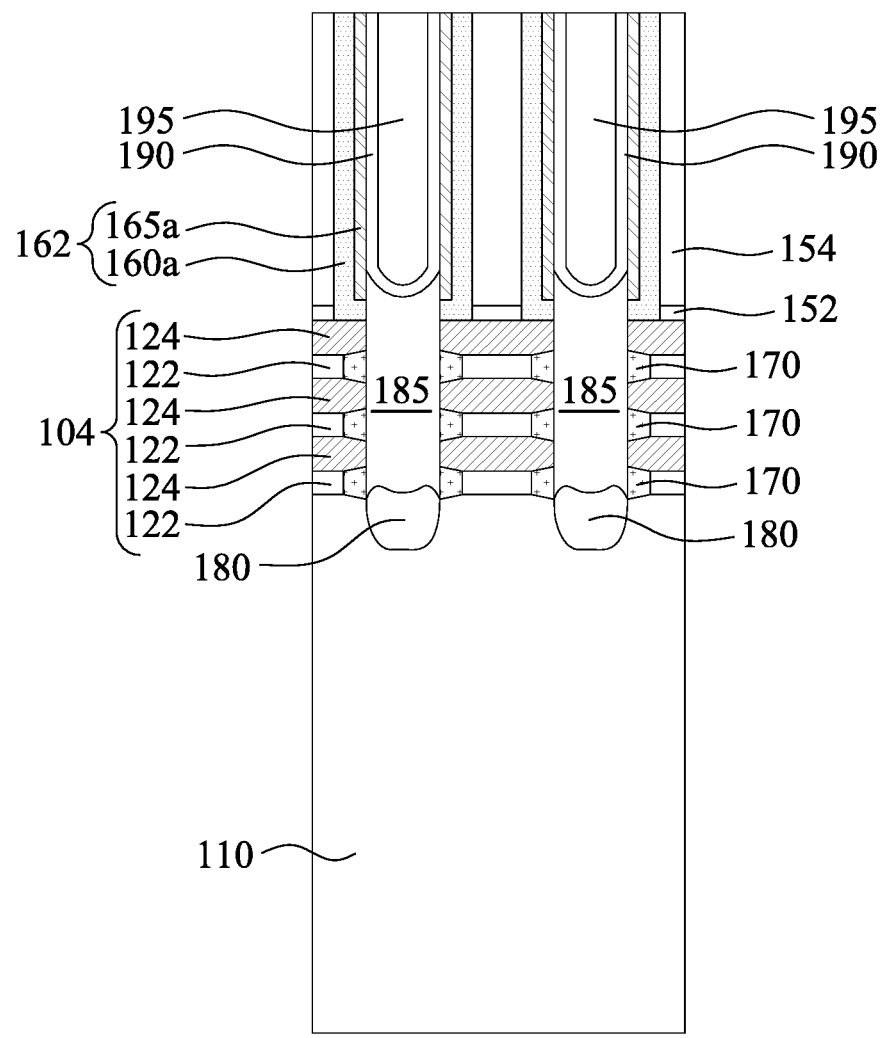

Reference is made to FIGS. 13A and 13B. A contact etch stop layer (CESL) 190 is conformally formed over the structure of FIGS. 12A and 12B. In some embodiments, the CESL 190 can be a stressed layer or layers. In some embodiments, the CESL 190 has a tensile stress and is formed of $Si_3N_4$. In some other embodiments, the CESL 190 includes materials such as oxynitrides. In yet some other embodiments, the CESL 190 may have a composite structure including a plurality of layers, such as a silicon nitride layer overlying a silicon oxide layer. The CESL 190 can be formed using plasma enhanced CVD (PECVD), however, other suitable methods, such as low pressure CVD (LPCVD), atomic layer deposition (ALD), and the like, can also be used.

An interlayer dielectric (ILD) 195 is then formed on the CESL 190. The ILD 195 may be formed by chemical vapor deposition (CVD), high-density plasma CVD, spin-on, sputtering, or other suitable methods. In some embodiments, the ILD 195 includes silicon oxide. In some other embodiments, the ILD 195 may include silicon oxy-nitride, silicon nitride, compounds including Si, O, C and/or H (e.g., silicon oxide, SiCOH and SiOC), a low-k material, or organic materials (e.g., polymers). After the ILD 195 is formed, a planarization operation, such as CMP, is performed, so that the pad layer 156 and the mask layer 158 (see FIG. 12B) are removed and the dummy gate electrode layer 154 is exposed. In some embodiments, the ILD 195 and the CESL 190 covers the spacer residues 178 as shown in FIG. 13A.

Figure 14A:
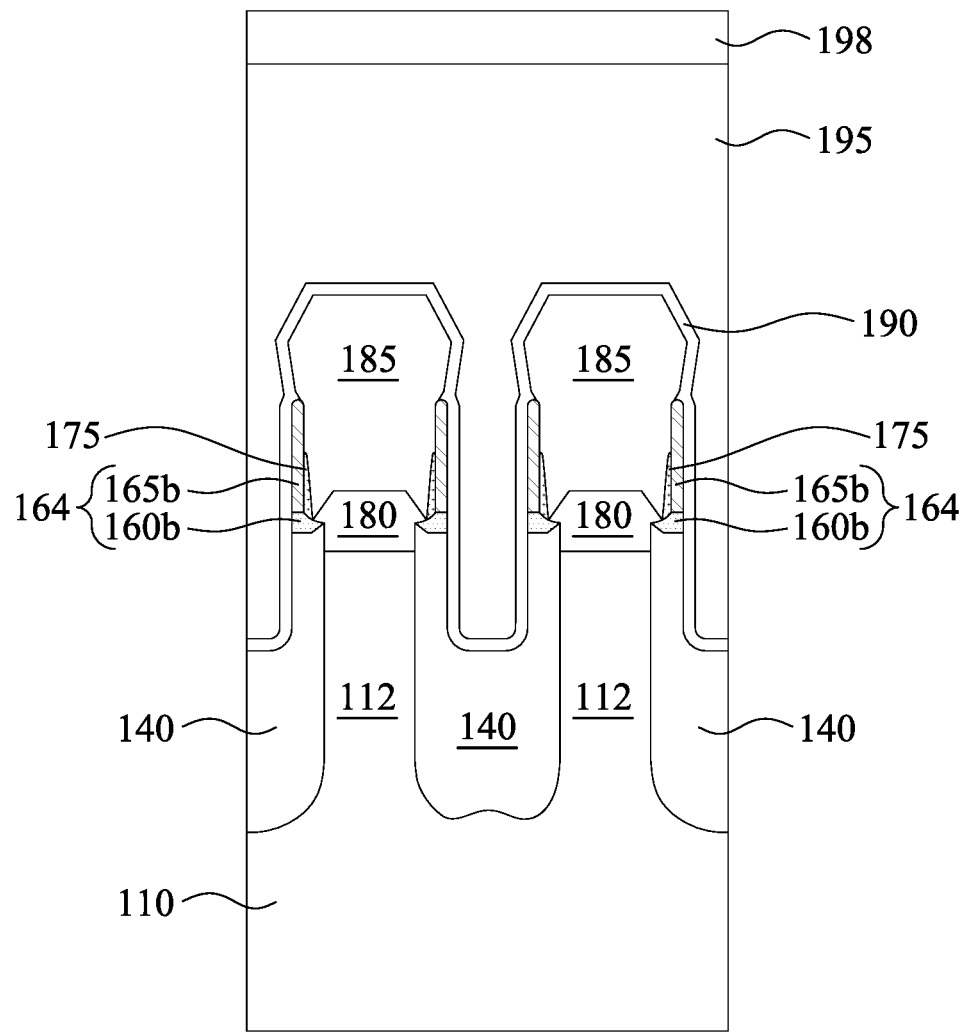
Figure 14B:
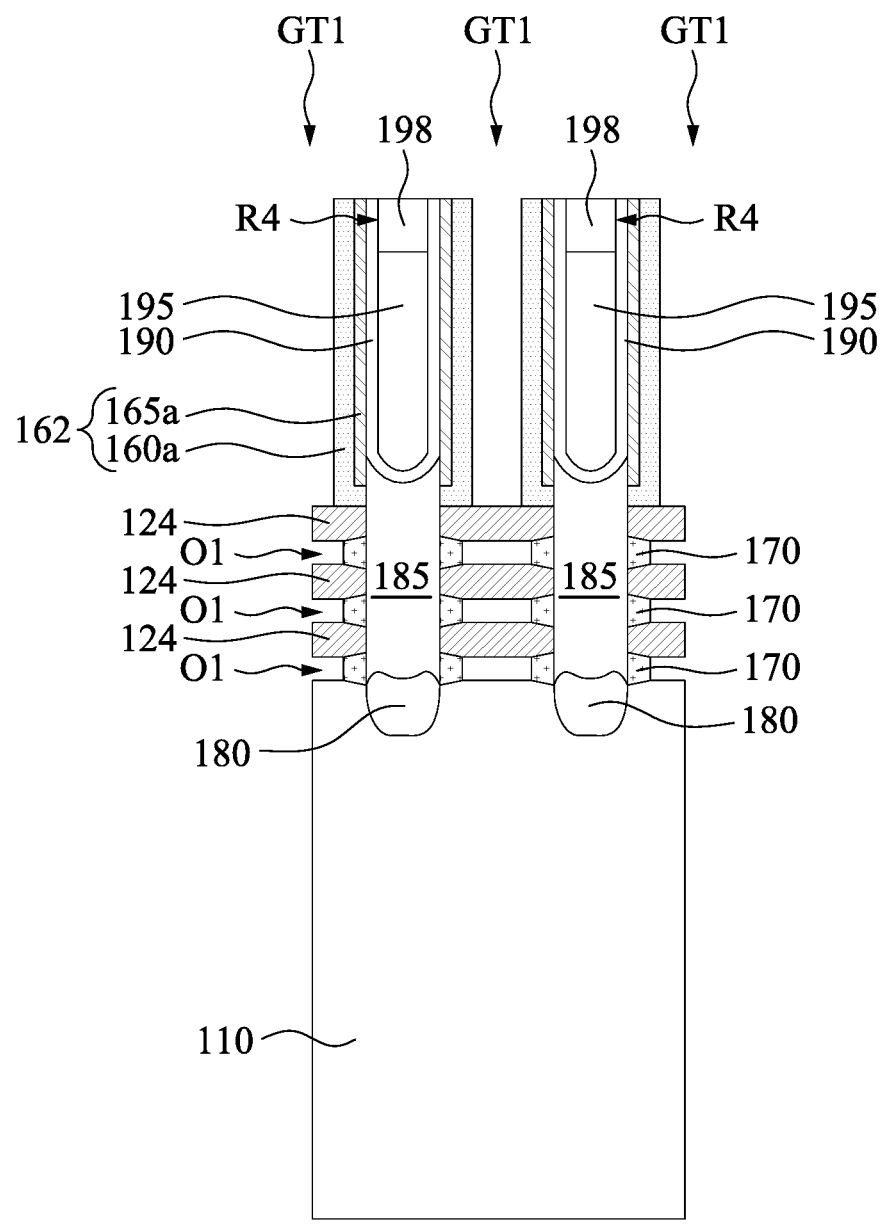

Reference is made to FIGS. 14A and 14B. The ILD 195 is etched back to a predetermined level and form recesses R4 thereon with the CESL 190 as their sidewalls. Then, capping layers 198 are formed in the recesses R4 using, for example, a deposition process to deposit a dielectric material over the substrate 110, followed by a CMP process to remove excess dielectric material outside the gate trenches. In some embodiments, the capping layers 198 include silicon nitride, silicon oxide, silicon oxynitride, SiCN, SiCON, SiOC, or other suitable dielectric material.

The dummy gate electrode layers 154 and the dummy gate dielectric layers 152 (see FIG. 13B) are then removed, thereby exposing the semiconductor layers 122 and 124. The capping layers 198 protect the top source/drain epitaxial structures 185 during the removal of the dummy gate electrode layers 154. In some embodiments, the dummy gate electrode layers 154 and the dummy gate dielectric layers 152 are removed by using a selective etching process (e.g., selective dry etching, selective wet etching, or a combination thereof) that etches the materials in dummy gate electrode layers 154 and the dummy gate dielectric layers 152 at a faster etch rate than it etches other materials (e.g., the gate spacers 162 and/or capping layers 198), thus resulting in gate trenches GT1 between corresponding gate spacers 162, with the semiconductor layers 122 exposed in the gate trenches GT1. Subsequently, the semiconductor layers 122 in the gate trenches GT1 are removed by using another selective etching process that etches the semiconductor layers 122 at a faster etch rate than it etches the semiconductor layers 124, thus forming openings O1 between neighboring semiconductor layers (i.e., channel layers) 124. In this way, the semiconductor layers 124 become nanosheets suspended over the substrate 110 and between the top source/drain epitaxial structures 185. This operation is also called a channel release process. In some embodiments, the semiconductor layers 124 can be interchangeably referred to as nanostructure (nanowires, nanoslabs and nanorings, nanosheet, etc., depending on their geometry). For example, in some other embodiments the semiconductor layers 124 may be trimmed to have a substantial rounded shape (i.e., cylindrical) due to the selective etching process for completely removing the semiconductor layers 122. In that case, the resultant semiconductor layers 124 can be called nanowires.

Figure 15A:
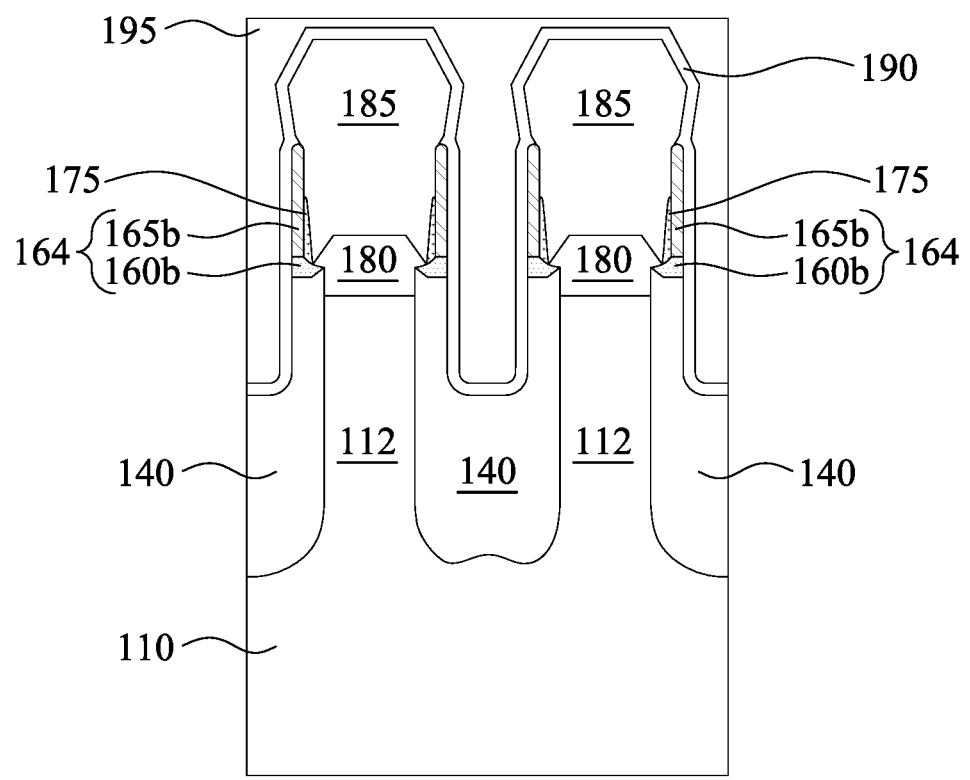
Figure 15B:
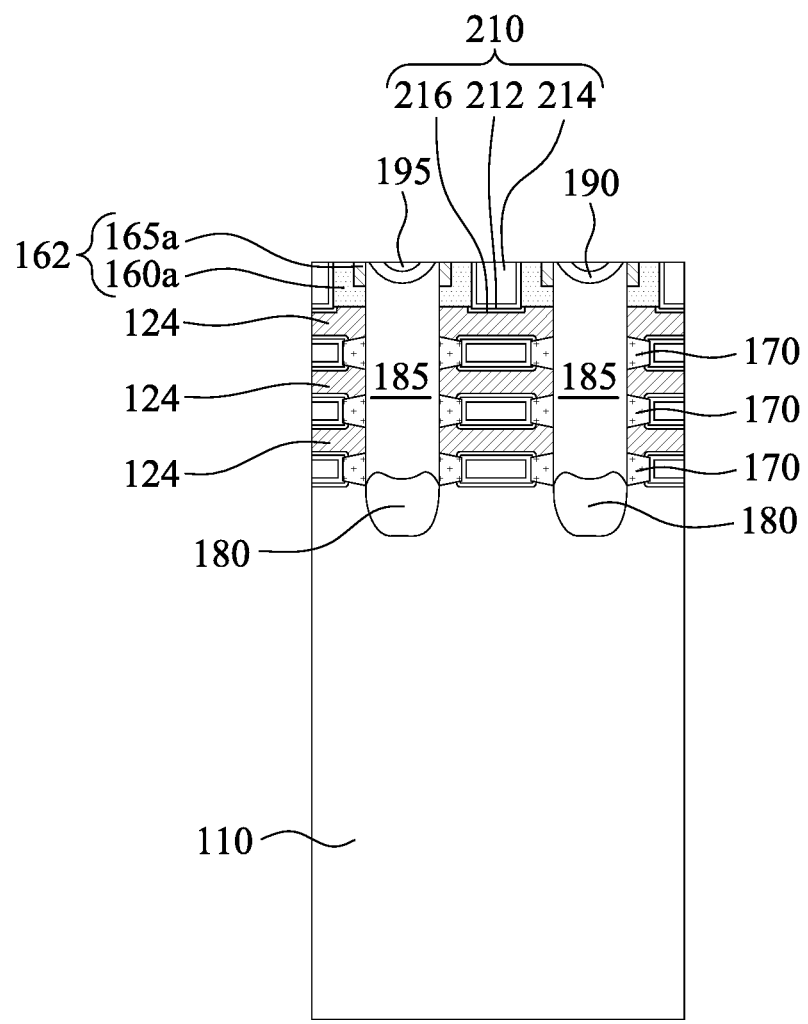

Reference is made to FIGS. 15A and 15B. Thereafter, replacement gate structures 210 are respectively formed in the gate trenches GT1. The gate structures 210 may be the final gates of FinFETs. The final gate structures each may be a high-k/metal gate structure, however other compositions are possible. The gate structure 230 encircles (wraps) the semiconductor layers 124, in which the semiconductor layers 124 are referred to as channels of the semiconductor device. Stated differently, the semiconductor layers 124 are embedded in the gate structures 210. The gate spacers 160 are disposed on opposite sides of the gate structure 210. Each of the gate structures 210 includes a gate dielectric layer 212 and a gate electrode 214. The gate electrode 214 includes one or more work function metal layer (s) and a filling metal. The gate dielectric layer 212 is conformally formed. Furthermore, the gate dielectric layer 212 surrounds the semiconductor layers 124, and spaces between the semiconductor layers 124 are still left after the deposition of the gate dielectric layer 212. In some embodiments, the gate dielectric layer 212 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 212 may be formed by performing an ALD process or other suitable process.

In some embodiments, interfacial layers 216 of the gate structures 210 are optionally formed to surround exposed surfaces of the second semiconductor layers 124 and exposed surfaces of the base portions of the substrate 110. In various embodiments, the interfacial layer 216 may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods.

The work function metal layer of the gate electrode 214 is conformally formed on the gate dielectric layer 212, and the work function metal layer surrounds the semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process. The filling metal of the gate electrode 214 fills the remained space between the gate spacers 160 and between the inner spacers 170. That is, the work function metal layer(s) is in contact with and between the gate dielectric layer 212 and the filling metal. The filling metal may include material such as tungsten or aluminum. After the deposition of the gate dielectric layer 212 and the gate electrode 214, a planarization process, such as a CMP process, may be then performed to remove excess portions of the gate dielectric layer 212 and the gate electrode 214 to form the gate structure 210. In some embodiments, the CMP process also removes the capping layers 198 (see FIG. 14B), top portions of the gate spacers 162, and top portions of the ILD layer 195 and CESL 190, such that a height of the device is reduced.

Figure 16A:
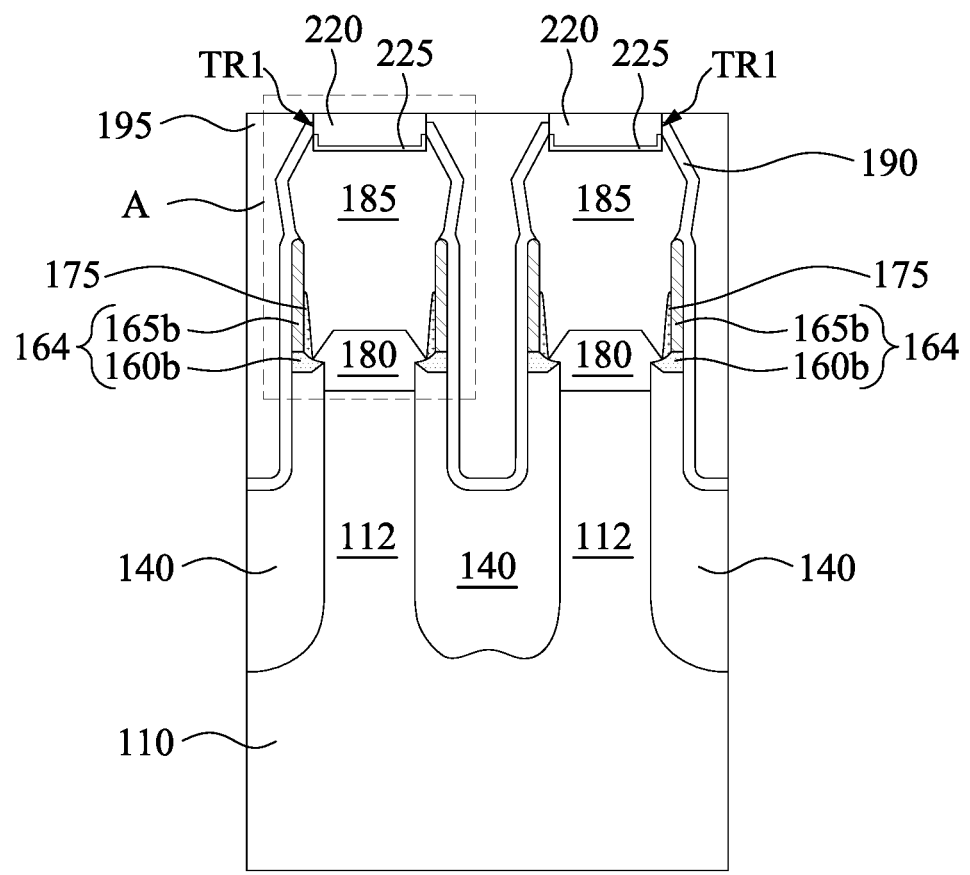
FIG. 16C is an enlarged view of an area A in FIG. 16A.
Figure 16B:
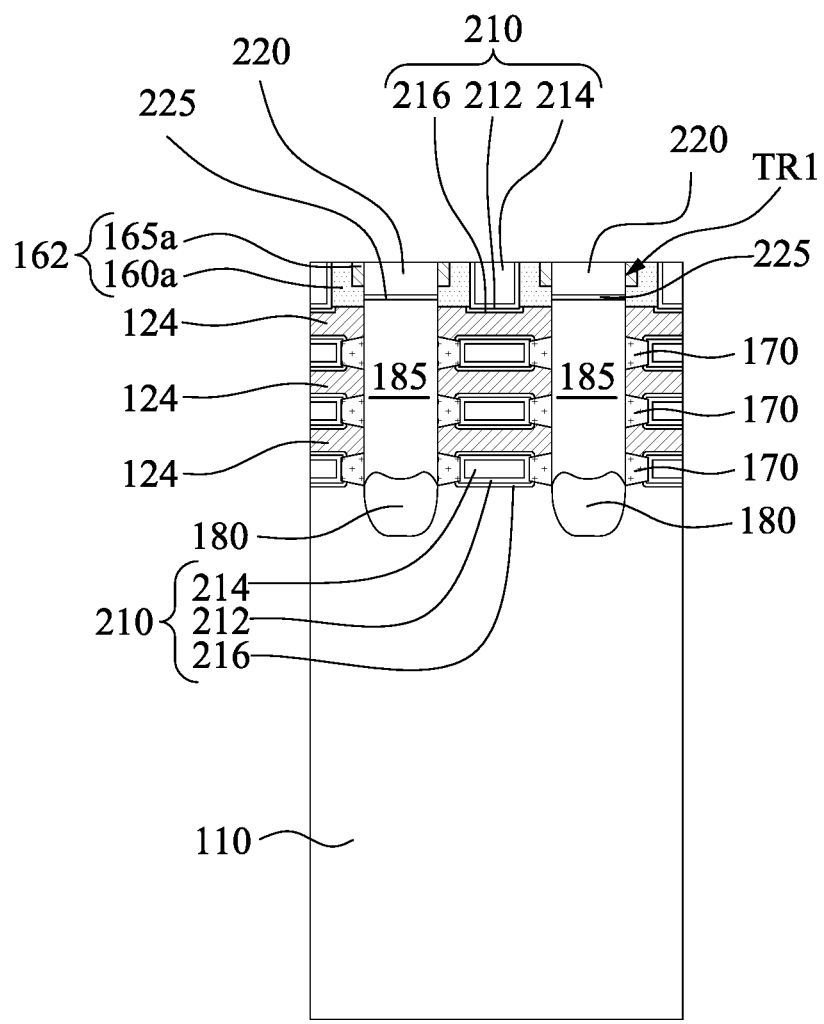

Reference is made to FIGS. 16A and 16B. The ILD layer 195 is then patterned to form contact trenches TR1 on opposite sides of the gate structures 210, and then the CESL 190 is patterned to expose the top source/drain epitaxial structures 185. In some embodiments, multiple etching processes are performed to pattern the ILD layer 195 and the CESL 190. The etching processes include dry etching process, wet etching process, or combinations thereof.

In some embodiments, metal alloy layers 225 are respectively formed above the top source/drain epitaxial structures 185. The metal alloy layers 225, which may be silicide layers, are respectively formed in the trenches and over the exposed top source/drain epitaxial structures 185 by a self-aligned silicide (salicide) process. The silicide process converts the surface portions of the exposed top source/drain epitaxial structures 185 into the silicide contacts. Silicide processing involves deposition of a metal that undergoes a silicidation reaction with silicon (Si). In order to form silicide contacts on the exposed top source/drain epitaxial structures 185, a metal material is blanket deposited on the exposed top source/drain epitaxial structures 185. After heating the wafer to a temperature at which the metal reacts with the silicon of the exposed top source/drain epitaxial structures 185 to form contacts, unreacted metal is removed. The silicide contacts remain over the exposed top source/drain epitaxial structures 185, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layers 225 may include germanium.

Contacts 220 are then formed in the contact trenches TR1 and above the metal alloy layers 225. As such, the contacts 220 are electrically connected to the top source/drain epitaxial structures 185. In some embodiments, the contacts 220 may be made of metal, such as W, Co, Ru, Al, Cu, or other suitable materials. After the deposition of the contacts 220, a planarization process, such as a chemical mechanical planarization (CMP) process, may be then performed. In some embodiments, barrier layers may be formed in the trenches before the formation of the contacts 220. The barrier layers may be made of TiN, TaN, or combinations thereof.

In FIGS. 16A and 16B, the semiconductor device includes the channel layers 134, the gate structures 210 wrapping around the channel layers 124, the (top) source/drain epitaxial structures 185 on opposite sides of the channel layer 124 and connected to the channel layers 124, and the sidewall spacers 164 on opposite sidewalls of the source/drain epitaxial structures 185. The sidewall spacers 164 includes the first dielectric layer 160*b* (which is referred to as a bottom dielectric layer) and the second dielectric layer 165b (which is referred to as a top dielectric layer) over the first dielectric layer 160b. The first dielectric layer 160b and the second dielectric layer 165b include different materials.

Figure 16C:
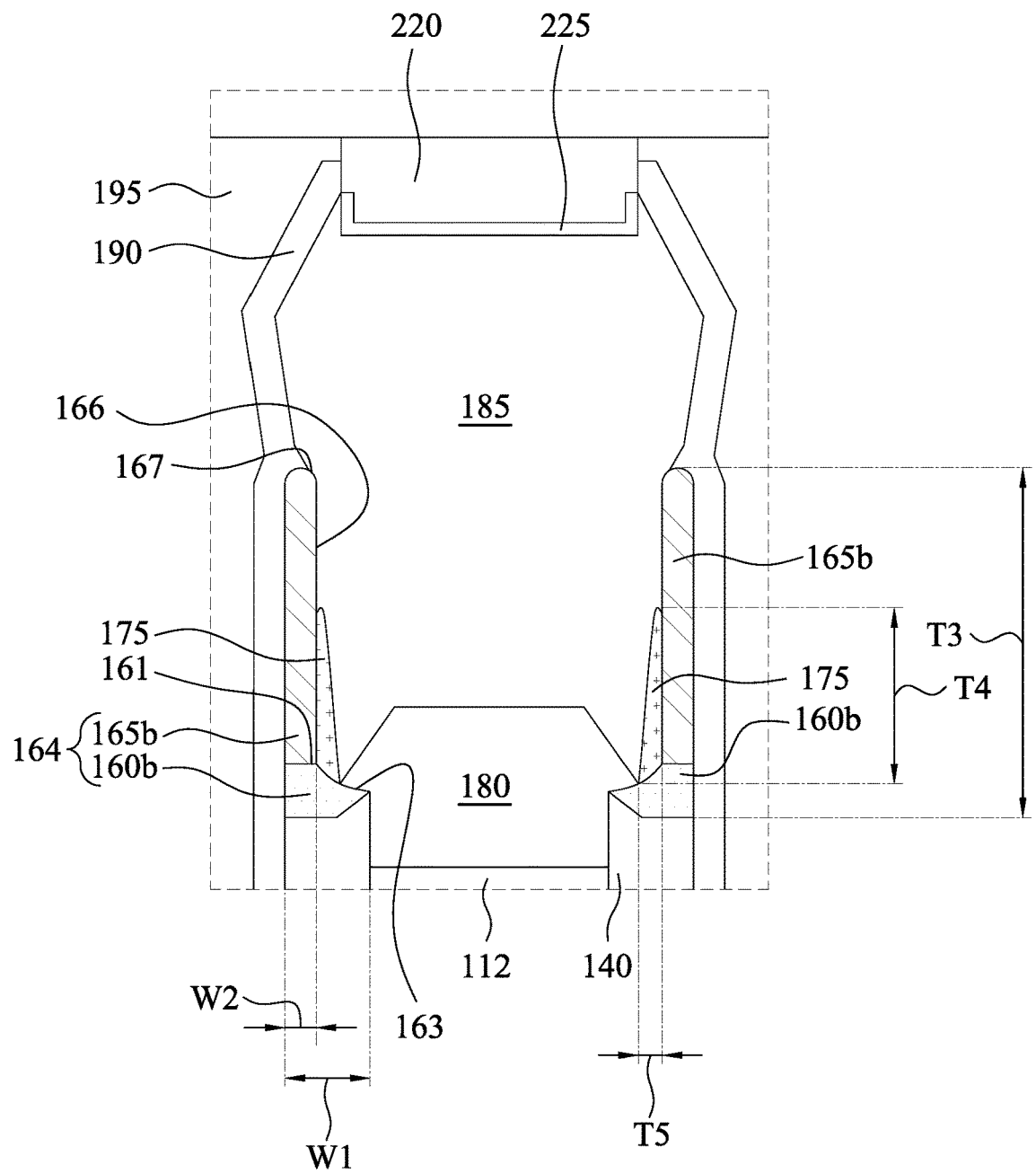

As shown in FIG. 16C, which is an enlarged view of an area A in FIG. 16A, a width W1 of the first dielectric layer 160b is greater than a width W2 of the second dielectric layer 165b. A difference between the widths W1 and W2 is in a range of about 1 nm to about 10 nm. In some embodiments, the first dielectric layer 160b is spaced apart from the inner sidewall 166 of the second dielectric layer 165b. The top source/drain epitaxial structure 185 is in contact with the inner sidewall 166 of the second dielectric layer 165b. In some embodiments, the top source/drain epitaxial structure 185 is spaced apart from the first dielectric layer 160b. In some embodiments, a topmost surface 161 of the first dielectric layer 160b is lower than a topmost surface 167 of the second dielectric layer 165b. Further, the top source/drain epitaxial structure 185 may be in contact with the topmost surface 167 of the second dielectric layer 165b. Moreover, the semiconductor device further includes the bottom source/drain epitaxial structure 180 in contact with a concave surface 163 of the first dielectric layer 160b.

In some embodiments, the semiconductor device further includes the spacer residue 175 sandwiched between the top source/drain epitaxial structure 185 and the second dielectric layer 165b of the sidewall spacer 164. Hence, the spacer residue 175 is in contact with the inner sidewall 166 of the second dielectric layer 165b. In some embodiments, the vertical thickness T4 of the spacer residue 175 is smaller than the vertical thickness T3 of the sidewall spacer 164, and the lateral thickness T5 of the spacer residue 175 is smaller than about 5 nm. Further, the spacer residues 175 are directly over the first dielectric layers 160b of the sidewall spacers 164. In some embodiments, the spacer residues 175 are completely over the first dielectric layers 160b (as shown in FIG. 10A) such that the spacer residues 175 are spaced apart from the base portions 112 and the channel layers 124.

As shown in FIG. 16B, the semiconductor device further includes gate spacers 162 on opposite sides of the gate structures 210. Each of the gate spacers 162 includes the first dielectric layer 160a and the second dielectric layer 165a. The first dielectric layer 160a is in contact with the gate structure 210, and the second dielectric layer 165a is separated from the gate structure 210 by the first dielectric layer 160a. The first dielectric layers 160a and 160b are made of the same material, and the second dielectric layers 165a and 165b are made of the same material. In some embodiments, the semiconductor device further includes the CESL 190 in contact with the first dielectric layer 160b and the second dielectric layer 165b of the sidewall spacer 164.

Figure 17:
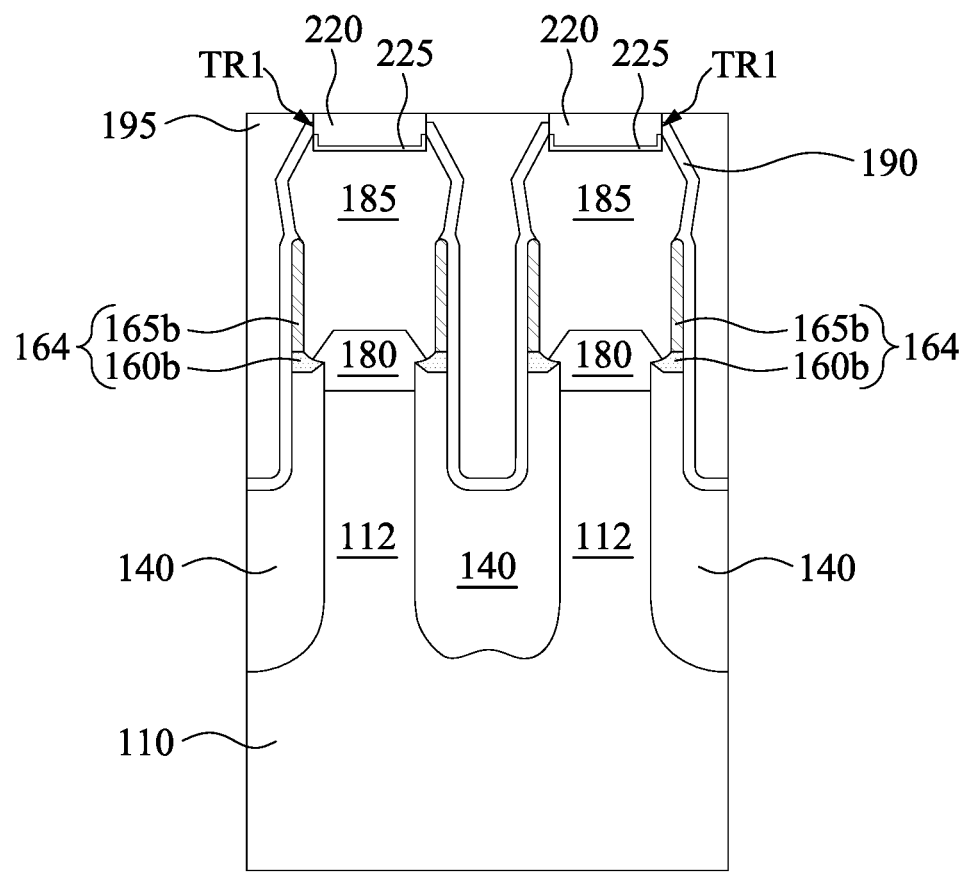
FIG. 17 is a cross-sectional view of a semiconductor device in accordance with some embodiments of the present disclosure.

FIG. 17 is a cross-sectional view of a semiconductor device in accordance with some embodiments of the present disclosure. The difference between the semiconductor devices in FIGS. 17 and 16A pertains to the presence of the spacer residues 175. In FIG. 17, the spacer residues 175 (see FIG. 16A) is completely removed from the corner between the sidewall spacer 164 and the gate spacers 162, such that there is no spacer residue between the top source/drain epitaxial structure 185 and the sidewall spacer 164. Other features of the semiconductor device shown in FIG. 17 are similar to those of the semiconductor device shown in FIG. 16A, and therefore, a description in this regard will not be provided hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the etched-back first dielectric layer provides an extra space for accommodating the spacer residues, such that the spacer residues (if exist) does not cover or block the outer sidewall of the channel layer. Otherwise, the spacer residue may reduce the contact area between the channel layer and the source/drain epitaxial structure. Another advantage is that the etched-back first dielectric layer also provides an enlarged window for accommodating the source/drain epitaxial structure.

According to some embodiments, a device includes a channel layer, a gate structure, a first source/drain epitaxial structure, a second source/drain epitaxial structure, and a sidewall spacer. The channel layer is over a substrate. The gate structure wraps around the channel layer. The first source/drain epitaxial structure and the second source/drain epitaxial structure are on opposite sides of the channel layer. The sidewall spacer is on a sidewall of the first source/drain epitaxial structure and includes a first dielectric layer and a second dielectric layer over the first dielectric layer and in contact with first source/drain epitaxial structure. The first dielectric layer and the second dielectric layer include different materials.

According to some embodiments, a device includes a gate structure, a nanostructure, a first top source/drain structure, a second top source/drain structure, a sidewall spacer, and a spacer residue. The gate structure is over a substrate. The nanostructure is embedded in the gate structure. The first top source/drain structure and the second top source/drain structure are connected to the nanostructure and are on opposite sides of the gate structure. The sidewall spacer adjacent to the first top source/drain structure and includes a bottom dielectric layer and a top dielectric layer over the bottom dielectric layer. The spacer residue between the sidewall spacer and the first top source/drain structure. The spacer residue is directly over the bottom dielectric layer.

According to some embodiments, a method includes forming a fin structure over a substrate, wherein the fin structure includes a sacrificial layer and a channel layer over the sacrificial layer; forming a dummy gate structure over the fin structure; forming a sidewall spacer on a sidewall of the fin structure, wherein the sidewall spacer includes a first dielectric layer and a second dielectric layer outside the first dielectric layer; removing a portion of the fin structure such that a remaining portion of the fin structure is under the dummy gate structure; etching back the first dielectric layer of the sidewall spacer such that the second dielectric layer of the sidewall spacer protrudes from the first dielectric layer; epitaxially growing a source/drain structure over the substrate and in contact with the channel layer of the remaining portion of the fin structure; and replacing the dummy gate structure and the sacrificial layer with a metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure over a substrate, wherein the fin structure comprises a sacrificial layer and a channel layer over the sacrificial layer;
forming a dummy gate structure over the fin structure;
forming a sidewall spacer on a sidewall of the fin structure, wherein the sidewall spacer comprises a first dielectric layer and a second dielectric layer outside the first dielectric layer;
removing a portion of the fin structure and portions of the first dielectric layer and the second dielectric layer such that a remaining portion of the fin structure is under the dummy gate structure;
after removing the portion of the fin structure and the portions of the first dielectric layer and the second dielectric layer, etching back the first dielectric layer of the sidewall spacer such that the second dielectric layer of the sidewall spacer protrudes from the first dielectric layer and a top of the second dielectric layer is higher than a top of the first dielectric layer;
epitaxially growing a source/drain structure over the substrate and in contact with the channel layer of the remaining portion of the fin structure; and
replacing the dummy gate structure and the sacrificial layer with a metal gate structure.

2. The method of claim 1, further comprising:
after etching back the first dielectric layer of the sidewall spacer, recessing the sacrificial layer of the remaining portion of the fin structure; and
forming an inner spacer on a sidewall of the recessed sacrificial layer.

3. The method of claim 2, wherein during forming the inner spacer on the sidewall of the recessed sacrificial layer, a spacer residue of the inner spacer is formed on an inner sidewall of the second dielectric layer of the sidewall spacer.

4. The method of claim 3, wherein the spacer residue is spaced apart from the channel layer of the remaining portion of the fin structure.

5. The method of claim 1, wherein a nitrogen concentration of the first dielectric layer is higher than a nitrogen concentration of the second dielectric layer.

6. The method of claim 1, further comprising forming a gate spacer on a sidewall of the dummy gate structure during forming the sidewall spacer.

7. A method comprising:
forming a channel structure over a substrate, wherein the channel structure has a channel region and a source/drain region;
forming a dummy gate structure across the channel region of the channel structure;
forming a spacer structure on a sidewall of the source/drain region of the channel structure, wherein the spacer structure comprises a first spacer layer and a second spacer layer, and the first spacer layer is between the second spacer layer and the channel structure;
removing the source/drain region of the channel structure and portions of the first spacer layer and the second spacer layer;
after removing the source/drain region of the channel structure and the portions of the first spacer layer and the second spacer layer, etching back the first spacer layer, such that a top of the second spacer layer is higher than a top of the first spacer layer;
epitaxially growing a source/drain structure to be in contact with the channel region of the channel structure and an inner sidewall of the second spacer layer; and
replacing the dummy gate structure with a metal gate structure.

8. The method of claim 7, wherein an oxygen concentration of the first spacer layer is greater than an oxygen concentration of the second spacer layer.

9. The method of claim 8, wherein the oxygen concentration of the first spacer layer is greater than the oxygen concentration of the second spacer layer by about 10% to about 50%.

10. The method of claim 7, wherein a nitrogen concentration of the first spacer layer is greater than a nitrogen concentration of the second spacer layer.

11. The method of claim 10, wherein the nitrogen concentration of the first spacer layer is greater than the nitrogen concentration of the second spacer layer by about 10% to about 50%.

12. The method of claim 7, wherein the first spacer layer comprises SiOCN.

13. The method of claim 7, wherein after etching back the first spacer layer, a remaining portion of the first spacer layer is under the second spacer layer.

14. A method comprising:
forming a gate structure over a channel region of a semiconductor channel, wherein the gate structure is spaced apart from a source/drain region of the semiconductor channel;
depositing a first dielectric film to cover the source/drain region of the semiconductor channel;
depositing a second dielectric film to cover the first dielectric film, wherein a composition of the first dielectric film is different from a composition of the second dielectric film;
performing a first etching process to remove the source/drain region of the semiconductor channel and portions of the first dielectric film and the second dielectric film, wherein a remaining portion of the first dielectric film and a remaining portion of the second dielectric film protrude from the gate structure;
after performing the first etching process, performing a second etching process to etch back the remaining portion of the first dielectric film, such that a top of the second dielectric film is higher than a top of the first dielectric film; and
forming a source/drain structure connected to the channel region of the semiconductor channel and the remaining portion of the second dielectric film.

15. The method of claim 14, wherein the first dielectric film and the second dielectric film are SiOCN with different compositions.

16. The method of claim 14, wherein a thickness of the first dielectric film is about 1 nm to about 10 nm.

17. The method of claim 14, wherein a thickness of the second dielectric film is about 3 nm to about 15 nm.

18. The method of claim 14, further comprising:
depositing a spacer material layer over the first dielectric film and the second dielectric film after performing the second etching process and prior to forming the source/drain structure; and
etching back the spacer material layer to expose an outer sidewall of the second dielectric film.

19. The method of claim 18, wherein after etching back the spacer material layer, a spacer residue of the spacer material layer is formed between the first dielectric film and the second dielectric film.

20. The method of claim 19, wherein after forming the source/drain structure, the source/drain structure is in contact with the spacer residue.

* * * * *